(12) United States Patent
Nghiem et al.

(10) Patent No.: US 11,352,691 B2
(45) Date of Patent: Jun. 7, 2022

(54) METHOD AND DEVICE FOR LOCATING THE ORIGIN OF A DEFECT AFFECTING A STACK OF THIN LAYERS DEPOSITED ON A SUBSTRATE

(71) Applicant: SAINT-GOBAIN GLASS FRANCE, Courbevoie (FR)

(72) Inventors: Bernard Nghiem, Arsy (FR); Yohan Faucillon, Coye-la-Foret (FR); Gregoire Mathey, Le Vesinet (FR); Thierry Kauffmann, Paris (FR)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 653 days.

(21) Appl. No.: 16/309,184

(22) PCT Filed: Jun. 22, 2017

(86) PCT No.: PCT/FR2017/051666
§ 371 (c)(1),
(2) Date: Dec. 12, 2018

(87) PCT Pub. No.: WO2018/002482
PCT Pub. Date: Jan. 4, 2018

(65) Prior Publication Data
US 2019/0309409 A1    Oct. 10, 2019

(30) Foreign Application Priority Data

Jun. 27, 2016 (FR) ..................................... 16 55951

(51) Int. Cl.
*C23C 14/18* (2006.01)
*C23C 14/54* (2006.01)
(Continued)

(52) U.S. Cl.
CPC ............ *C23C 14/185* (2013.01); *C23C 14/54* (2013.01); *G01N 21/8422* (2013.01);
(Continued)

(58) Field of Classification Search
CPC .......................... C23C 14/568; G01N 21/8422
See application file for complete search history.

(56) References Cited

U.S. PATENT DOCUMENTS 4,975,972 A * 12/1990 Bose ..................... G01N 21/88
348/126
9,251,581 B1   2/2016 Chen et al.
(Continued)

FOREIGN PATENT DOCUMENTS

JP    2016142572 A * 8/2016

OTHER PUBLICATIONS

International Search Report dated Oct. 9, 2017 in PCT/FR2017/051666 filed on Jun. 22, 2017.

*Primary Examiner* — John J Brayton
(74) *Attorney, Agent, or Firm* — Oblon, McClelland, Maier & Neustadt, L.L.P.

(57) ABSTRACT

A method for locating, in a deposition line including a succession of compartments, an origin of a defect affecting a stack of thin layers deposited on a substrate in the compartments, in which each thin layer is deposited in one or more successive compartments of the deposition line and pieces of debris remaining on the surface of a thin layer deposited in a compartment act as masks for the subsequent depositions of thin layers and are the origin of defects, includes obtaining at least one image showing the defect, determining, from the at least one image, a signature of the defect, the signature containing at least one characteristic representative of the defect, and identifying at least one compartment of the deposition line liable to be the origin of (Continued)

the defect from the signature of the defect and using reference signatures associated with the compartments of the deposition line.

23 Claims, 10 Drawing Sheets

(51) Int. Cl.
  *G01N 21/88* (2006.01)
  *G02B 1/10* (2015.01)
  *G06T 7/00* (2017.01)
  *G01N 21/84* (2006.01)
  *G01N 21/896* (2006.01)
  *G02B 5/28* (2006.01)
  *C23C 14/35* (2006.01)
(52) U.S. Cl.
  CPC ....... *G01N 21/8851* (2013.01); *G01N 21/896* (2013.01); *G02B 1/10* (2013.01); *G02B 5/285* (2013.01); *G06T 7/0004* (2013.01); *C23C 14/352* (2013.01); *G01N 2021/8825* (2013.01); *G01N 2021/8854* (2013.01); *G06T 2207/10024* (2013.01); *G06T 2207/30148* (2013.01)

(56) References Cited

U.S. PATENT DOCUMENTS

| | | | |
|---|---|---|---|
| 2007/0046927 A1* | 3/2007 | Le | C23C 16/54 356/73 |
| 2007/0254096 A1* | 11/2007 | Hepper | C03C 17/002 427/237 |
| 2010/0054577 A1 | 3/2010 | Yoshikawa | |
| 2010/0266195 A1* | 10/2010 | Iwanaga | G06K 9/4652 382/149 |
| 2011/0176029 A1* | 7/2011 | Boydston | H04N 1/46 348/223.1 |
| 2014/0313369 A1* | 10/2014 | Kageyama | G06T 5/50 348/223.1 |
| 2015/0060661 A1* | 3/2015 | Ikeda | H01J 37/28 250/307 |
| 2018/0147871 A1* | 5/2018 | Landa | B05D 3/007 |
| 2019/0041319 A1* | 2/2019 | Ruers | G01N 33/02 |

\* cited by examiner

METHOD AND DEVICE FOR LOCATING THE ORIGIN OF A DEFECT AFFECTING A STACK OF THIN LAYERS DEPOSITED ON A SUBSTRATE

BACKGROUND OF THE INVENTION

The invention relates to the manufacture of substrates, in particular transparent substrates made of glass or of organic polymeric material, coated on at least one face with a stack of thin layers.

It is conventional to equip substrates, in particular substrates made of glass or of organic polymeric material, with coatings that give these substrates particular properties, in particular optical properties, for example properties with respect to reflection or absorption of radiation in a domain of given wavelengths, electrical conduction properties, or even properties related to the ease of cleaning or the ability of the substrate to self-clean. These coatings are generally stacks of thin layers based on inorganic compounds, in particular metals, oxides, nitrides or carbides. In the context of the invention, the expression "thin layer" is understood to mean a layer the thickness of which is smaller than one micron and that is generally between a few nanometers and a few hundred nanometers, hence the term "thin".

A stack of thin layers is generally manufactured via a succession of depositions of thin layers carried out in a plurality of compartments of a deposition line (typically 20 to 30 compartments), these depositions being carried out in the various compartments using one or more deposition methods such as, in particular, magnetron cathode sputtering, ion-beam assisted deposition (IBAD), evaporation, chemical vapor deposition (CVD), plasma-enhanced chemical vapor deposition (PECVD), and/or low-pressure chemical vapor deposition (LPCVD).

Unfortunately, the compartments of the deposition line are often dirty, and pieces of dust or debris present in certain compartments may fall erratically on the substrate as the latter passes through these compartments. Some pieces of debris may remain on the surface of the substrate (more precisely on the surface of the thin layer deposited in the compartment in question) and then act as masks for the subsequent depositions of thin layers. These pieces of debris are the origin of defects affecting the quality of the stack of thin layers deposited on the substrate and which may prove to be unacceptable depending on the intended application of the coated substrate thus manufactured.

To control the quality of the coated substrate manufactured, optical inspecting systems, which are intended to be placed at the end of the deposition line, and which are configured to deliver various images of the stack of thin layers deposited on the surface of this substrate, are used in the state of the art. These optical inspecting systems are generally equipped with a bank comprising a plurality of optical sensors (video cameras) and a plurality of sources of radiation of different wavelengths, allowing images to be acquired in various configurations (e.g. images taken in reflection, in transmission, etc.). Analysis of these images allows any defects affecting the stack of thin layers produced in the deposition line to be detected.

Although present-day inspecting systems allow defects to be detected, they do not provide any information on the origin of these defects. However, knowledge of this origin could be of great value with a view to carrying out rapid and targeted maintenance operations on the deposition line.

SUBJECT AND SUMMARY OF THE INVENTION

The invention in particular allows the drawbacks of the prior art to be mitigated by providing a method for locating, in a deposition line comprising a succession of compartments, an origin of a defect affecting a stack of thin layers deposited on a substrate in said compartments, in which each thin layer of a material is deposited in one or more successive compartments of the deposition line and pieces of debris remaining on the surface of a thin layer deposited in a compartment act as masks for the subsequent depositions of thin layers and are the origin of defects, this method comprising:

a step of obtaining at least one image showing said defect, said at least one image being acquired by at least one optical inspecting system placed at the end of the deposition line;
  a step of determining, from said at least one image, a signature of the defect, this signature containing at least one characteristic representative of the defect; and
  a step of identifying at least one compartment of the deposition line liable to be the origin of the defect from the signature of the defect and using reference signatures associated with the compartments of the deposition line.

Correlatively, the invention also relates to a device for locating an origin of a defect affecting a stack of thin layers deposited on a substrate in a plurality of compartments that succeed one another in a deposition line, in which each thin layer of a material is deposited in one or more successive compartments of the deposition line and pieces of debris remaining on the surface of a thin layer deposited in a compartment act as masks for the subsequent depositions of thin layers and are the origin of defects, this device comprising:

a module for obtaining at least one image showing the defect, which at least one image is acquired by at least one optical inspecting system placed at the end of the deposition line;
  a module for determining, from said at least one image, a signature of the defect, this signature containing at least one characteristic representative of the defect; and
  a module for identifying at least one compartment of the deposition line liable to be the origin of the defect from the signature of the defect and using reference signatures associated with the compartments of the deposition line.

Thus, the invention provides a simple and effective way of locating the origin in a deposition line of a defect affecting a stack of thin layers deposited on a substrate.

In the context of the invention, the deposition of the stack of thin layers on the substrate is carried out while the substrate is run in succession through the various compartments of the deposition line, the environment of which is controlled. In particular, the complete stack of thin layers is deposited on the substrate without exposing the substrate to open air or cleaning the substrate between two compartments. Thus, pieces of debris that fall on the substrate in one compartment of the deposition line remain on the surface of the thin layer deposited in this compartment and act as masks for the subsequent depositions of thin layers, thereby creating defects. The invention then allows a small number of compartments of the deposition line, or even a single compartment, liable to be the origin of defects detected at the end of the deposition line, to be identified.

To do this, a reference signature associated with a given compartment of the deposition line is evaluated on the basis of a deposition of the stack of thin layers carried out by passing the substrate through all the compartments of the deposition line in the presence of at least one piece of debris generated by said given compartment. In other words, in the context of the invention, a reference signature associated with a given compartment is obtained under the conditions of generation of the complete stack of thin layers and, because of the presence of the piece of debris generated by said given compartment, certain thin layers may be missing locally in the stack. Outside of the location of the piece of debris, all the thin layers of the stack are present on the substrate, for the determination of the reference signature.

In one embodiment of the invention, the thin layers are deposited in the deposition line on the substrate using a magnetron cathode sputtering process. Each compartment of said deposition line then includes a sputtering target, lowered to a negative potential, called the "cathode" potential, containing the chemical elements to be deposited, and in the vicinity of which a plasma is created under a high vacuum. The active species of the plasma, by bombarding the target, tear out the chemical elements from the target, which deposit on the substrate, thereby forming the desired thin layer. This process is said to be reactive when the thin layer is made of a material resulting from a chemical reaction between the elements torn from the target and a gas contained in the plasma. One advantage of this magnetron cathode sputtering process resides in the fact that it is possible to deposit, on the same deposition line, a very complex stack of layers, by running the substrate in succession under various targets.

In the context of the invention, a plurality of successive compartments of the deposition line may participate in the deposition of a thin layer of a given material, in predefined proportions. Advantageously, in the case of a defect present in a thin layer of a given material deposited in a plurality of successive compartments of the deposition line, the invention allows the one or more compartments that were the origin of the defect to be identified among all the compartments participating in the deposition of this thin layer.

In the case of a magnetron cathode sputtering deposition line, the configuration of the various compartments in which the depositions of thin layers take place comprises adjusting various parameters of the magnetron cathode sputtering, and in particular, the pressure of the gas and its composition, the power applied to the cathode, the angle of incidence of the bombarding particles, the thickness of the deposition, etc.

The substrate is preferably a sheet made of mineral glass or made of an organic polymeric material. It is preferably transparent and may be tinted or untinted. The glass is preferably soda-lime-silica glass but it may also be, for example, a borosilicate or alumino-borosilicate glass. Preferred organic polymeric materials are polycarbonate, polymethyl methacrylate, polyethylene terephthalate (PET), polyethylene naphthalate (PEN), or even fluoropolymers such as ethylene tetrafluoroethylene (ETFE). The substrate may be rigid or flexible. The substrate may be planar or curved.

The solution according to the invention is based on the exploitation of digital images issued from an optical inspection conventionally carried out at the end of the deposition line. According to the invention, these images are analyzed with a view to extracting a signature of the defect containing one or more preset characteristics, representative of the defect, and the observation of which allows compartments of the deposition line liable to be the origin of the defect to be identified. To this end, the signature of the defect is compared directly or indirectly (for example by way of one or more decision trees) to various reference signatures, which are generated for each of the compartments of the deposition line, containing the same characteristics as the signature of the defect. A reference signature associated with a compartment represents the values of preset characteristics of a defect originating in this compartment. It may for example be obtained experimentally by knocking on the walls of the compartment so as to generate, in each compartment, pieces of debris resulting from the knocking; by simulation; or by calculation. It will be noted that a plurality of reference signatures may be associated with each of the compartments of the deposition line. Likewise, each reference signature does not necessarily correspond to a single point but may correspond to an interval of values, a section of a curve, a section of a surface, etc. depending on the number of components contained in the reference signature.

Analysis of the signature of the defect taking into account the reference signatures associated with the various compartments of the deposition line allows a small number of compartments of the deposition line, or even a single compartment, liable to be the origin of the defect, to be identified.

Thus, for example, in one particular embodiment, the identifying step comprises a step of comparing the signature of the defect with a plurality of reference signatures associated with each compartment of the deposition line, said at least one compartment identified as being liable to be the origin of the defect being associated with a reference signature corresponding to the signature of the defect. In other words, the one or more compartments identified as being liable to be the origin of the defect are in this case the compartments the reference signatures of which are the most like the signature of the defect, in the sense for example of a predefined distance, or, equivalently, of a predefined prediction error.

The invention is advantageously applicable to various stacks of thin layers liable to be deposited on a substrate, in particular a transparent substrate, and in particular to a stack of thin layers forming an interferential system. The choice of the one or more characteristics of the signature of the defect, i.e. the signature used in the context of the invention, is made depending on the optical properties of the stack of thin layers in question, in particular on its properties with respect to reflection or transmission of radiation, and on the type of images delivered by the optical inspecting system (images taken in reflection, images taken in transmission, images obtained with sources of radiation able to emit in various wavelength domains, etc.).

By way of examples of stacks of thin layers able to be deposited on a substrate and analyzed according to the invention, mention may be made, nonlimitingly, of:

stacks of thin layers that modify the reflective properties of the substrate in the visible wavelength domain, such as reflective metal layers, in particular reflective metal layers based on silver metal, which are used to form mirrors or even antireflection coatings, and which are intended to decrease the reflection of radiation at the air-substrate interface. An antireflection coating may be formed, in particular, by a stack of thin layers having refractive indices that are, in alternation, lower and higher, playing the role of an interference filter at the air-substrate interface, or even by a stack of thin layers creating a continuous or stepped refractive-index gradient between the refractive index of air and that of the substrate;

stacks of thin layers that give the substrate reflective properties in the infrared, such as transparent stacks comprising at least one thin metal layer or at least one thin layer based on transparent conductive oxide (TCO), i.e. what is (are) called (a) functional layer(s), in particular at least one thin layer based on silver, niobium, chromium, nickel-chromium alloy (NiCr), indium tin oxide (ITO), and coatings located on either side of each functional layer to form an interferential system. These transparent stacks with reflective properties in the infrared are used to form solar-control and in particular anti-solar glazings, which are intended to decrease the amount of solar energy entering a building or a vehicle, or low-emissivity glazings, which are intended to decrease the amount of energy dissipated from a building or a vehicle;

stacks of thin layers that give the substrate electrically conductive properties, such as transparent stacks comprising at least one thin metal layer, in particular at least one thin silver-based layer, or at least one thin layer based on transparent conductive oxides (TCOs), for example based on indium tin oxide (ITO), based on indium zinc oxide (IZO), based on aluminum- or gallium-doped zinc oxide, based on niobium-doped titanium oxide, based on zinc or cadmium stannate, and/or based on antimony- and/or fluorine-doped tin oxide. These coatings with electrically conductive properties are in particular used in heated glazings, in which an electrical current is made to flow through the coating so as to generate heat via joule heating, or even by way of an electrode in layered electronic devices, and in particular by way of the transparent electrode located on the front face of organic light-emitting diode (OLED) devices, photovoltaic devices, electrochromic devices, etc.;

stacks of thin layers that give the substrate self-cleaning properties, such as transparent stacks based on titanium oxide, which facilitate the degradation of organic compounds under the action of ultraviolet radiation and the removal of mineral dirt under the action of a rivulet of water;

stacks of thin layers that give the substrate anticondensation properties, hydrophobic properties, etc.

The one or more characteristics chosen to form the signature of the defect preferably have a value that varies as a function of the compartments participating in the deposition of the stack of thin layers, so as to easily allow a compartment in which a defect in this stack originated to be identified. For example, a characteristic may be chosen the value of which is a strictly monotonic (i.e. increasing or decreasing) function of deposition thickness on the substrate, so that the value of this characteristic in the signature of the defect allows a deposition thickness at which said defect appeared to be identified. From knowledge of this thickness and the compartment responsible for depositing a thin layer corresponding to this thickness, it is possible to easily deduce the compartment in which the defect originated. This choice of a characteristic that is strictly monotonic as a function of deposition thickness on the substrate is particularly advantageous because it allows, from a signature containing a single well-chosen characteristic, a single compartment that was the origin of the defect to be identified.

An unequivocal relationship between the value of each characteristic of the signature and a compartment of the deposition line is however not an essential condition of the invention; in other words, it is not necessary for each compartment to correspond to a distinct value of each characteristic. Specifically, an ambiguity, or degeneracy, between two or more compartments may remain when one given characteristic is considered. In particular, a given value of a characteristic may correspond to two distinct compartments of the deposition line.

Specifically, it will firstly be noted that, including in the case where an ambiguity remains, the invention allows the number of compartments suspected as being the origin of the defect to be drastically decreased. As mentioned above, in the case of a deposition of a stack of thin layers on a substrate, a deposition line may easily comprise 20 or even 30 compartments. The invention makes it possible to limit, to a few, the number of compartments for which an ambiguity remains, i.e. by choosing the characteristics well, to at most two or three compartments. Moreover, it is possible to further decrease this number by considering a plurality of characteristics in the signature of the defect, the multiplicity of characteristics allowing residual ambiguities to be removed.

It will be noted that the characteristics considered to form the signature of a defect may depend on the nature of the images obtained and delivered by the optical systems (e.g. images taken in reflection or in transmission, types of radiation sources used to generate the images, etc.). The use of images of different natures may advantageously allow the aforementioned ambiguities to be removed by using various complementary characteristics extracted from each type of image to form the signature of the defect.

Said at least one image showing the defect may, in particular, be a grayscale-encoded image, an RGB-encoded image, and/or a hyperspectral image.

Thus, by way of illustration, in one particular embodiment, said at least one image may comprise a grayscale-encoded image taken in reflection and a grayscale-encoded image taken in transmission.

This embodiment may preferably but not only be applied when the stack of thin layers comprises a plurality of layers having a low emissivity. The use of information extracted from an image taken in transmission in addition to information extracted from the image taken in reflection makes it possible to obtain a signature containing more characteristics, and the origin of the defect affecting the stack of thin layers to be located with greater precision.

In another embodiment, said at least one image may comprise two grayscale-encoded images (taken in reflection and/or transmission) acquired by said at least one optical system using two radiation sources emitting in two at least partially distinct wavelength domains, in particular a radiation source emitting in the visible wavelength domain and a radiation source emitting in the infrared wavelength domain. The combination of images obtained using two radiation sources emitting at different wavelengths, which are cleverly chosen, may allow an ambiguity to be removed.

Specifically, certain stacks may have characteristics that are strictly monotonic as a function of deposition thickness in the infrared domain, which this embodiment advantageously makes it possible to exploit.

The invention therefore allows targeted maintenance to be carried out on the deposition line, the maintenance operations (and in particular cleaning operations) or more generally corrective actions being concentrated on the few compartments identified, or even on one single compartment. Such corrective actions may typically consist in knocking on the walls of each identified compartment in order to clear them of any pieces of dust and debris that are covering them and that are liable to be deposited on the substrate during the deposition of the thin layer deposited in this compartment. These maintenance operations may take place either during production, or at the end of production.

The invention thus makes it possible to intervene more promptly and more effectively on the deposition line, while limiting the associated costs. By virtue of the invention, the identification of the one or more compartments that were the origin of defects is furthermore very rapid. As a result, when the appearance of defects on coated substrates output from the deposition line is detected, the time taken to resolve the underlying problem is substantially decreased.

In one particular embodiment:
- said at least one image comprises a grayscale-encoded image taken in reflection and the signature of the defect contains a characteristic defined with respect to a reflection coefficient of the defect, which is determined from the image taken in reflection; and/or
- said at least one image comprises a grayscale-encoded image taken in transmission, and the signature of the defect contains a characteristic defined with respect to a transmission coefficient of the defect, which is determined from the image taken in transmission.

These reflection and/or transmission coefficients may for example be determined using a successive erosion method applied to the defect shown in the grayscale-encoded image, and during which, in each step, a value of the reflection and/or transmission coefficient is determined. Other methods may of course be envisioned instead.

Specifically, the inventors have judiciously discovered that it is possible, from the grayscale-encoded image taken in reflection of the defect or the grayscale-encoded image taken in transmission of the defect, and more particularly a contrast level in reflection or in transmission of the defect, which is determined from this image, to identify the compartment(s) in which this defect could have been generated. More particularly, the inventors have established a correlation between the contrast level in reflection or in transmission of the defect and the thickness at which the stack was stopped following the drop of a piece of dust or debris, in other words, the thickness at which the defect appeared. This thickness may be easily associated with a compartment of the deposition line participating in the deposition of the stack of thin layers. It will be noted that when the image is not hyperspectral, the invention is based on the assumption that the contrast value in question extracted from the images delivered by the optical inspecting system expresses the "true" integrated contrast value (in reflection or in transmission) i.e. the value that would be calculated from the (reflection or transmission) spectrum. By "expresses", what is meant is that the contrast value in question is representative of this true value, either absolutely or relatively (i.e. it may be proportional to this true value or be a monotonic function thereof).

By way of illustration, in the case of a transparent stack of thin layers with reflective properties in the infrared such as described above, comprising a thin silver layer flanked by two coatings each comprising one or more thin layers, so as to form an interferential system, the (optionally normalized) average light reflection coefficient observed in the image taken in reflection may be observed to vary as a function of the thickness of the stack, this variation being the shape of an inverted V (i.e. Λ-shaped), and having a maximum level with the thin silver layer. This maximum level with the silver layer is due to the low emissivity of the silver layer, which results in a maximum light reflectance. In other words, the variation of the light reflection coefficient as a function of thickness is an increasing function before the silver layer then a decreasing function thereafter. It is therefore easy to pick, on the basis of this representation and of knowledge of what are called reference light reflection coefficients characterizing each of the compartments of the deposition line, from the compartments of a first series of compartments participating in the deposition of the first coating deposited before the silver layer, a compartment liable to be the origin of the defect, or to pick, from the compartments of a second series of compartments participating in the deposition of the second coating deposited after the silver layer, a compartment liable to be the origin of the defect.

Thus, in the example illustrated above, if the signature of the defect contains a single characteristic defined with respect to the average light reflection coefficient of the defect, at the end of the method according to the invention two compartments liable to be the origin of the defect observed in the stack of thin layers are identified.

To determine whether the compartment that was the origin of the observed defect belongs to the first or second series of compartments, the inventors advantageously propose to exploit a second characteristic of the defect, namely, in the aforementioned example, the presence or absence of a light ring (i.e. a ring corresponding to a reflection maximum) encircling the defect in the image taken in reflection.

In one particular embodiment of the invention, the locating method therefore furthermore comprises a step of detecting a presence of a light ring on the perimeter of the defect shown in said at least one image, the signature of the defect containing a characteristic expressing this presence.

Specifically, the inventors have linked the presence of such a light ring to the introduction of a defect before the deposition of the silver layer, i.e. in a compartment of the first series of compartments participating in the deposition of the first coating deposited before the silver layer, the absence of such a light ring in contrast meaning that a defect was introduced after the deposition of the silver layer, i.e. in a compartment of the second series of compartments participating in the deposition of the second coating deposited after the silver layer. It will be noted that the presence of such a light ring may be easily detected by virtue of the use of the aforementioned erosion method, by observing the values of the light reflection coefficient that are obtained in the various iterations of the erosion method, and in particular in the first iterations.

This also applies when the optical system delivers an image taken in transmission of the defect and a characteristic of the signature of the defect is determined from a light transmission coefficient of the defect. In one particular embodiment of the invention, the method furthermore comprises:
- a step of determining a gradient of variation in the (reflection or transmission) coefficient; and
- a step of detecting a shape of the defect on the basis of the determined variation gradient.

This embodiment allows complementary information on the defect, and in particular information regarding whether it is a question of a flat or three-dimensional defect, to be obtained. Such information may be useful for identifying, within a given compartment, which elements of the compartment were the origin of the pieces of dust and/or debris that were deposited on the substrate.

The invention may be applied, as mentioned above, to grayscale-encoded images (e.g. images, taken in reflection and/or in transmission, acquired by means of a radiation source emitting in the visible wavelength domain and/or in the infrared wavelength domain, etc.). However, this assumption is nonlimiting and the invention may also be implemented using other types of images. The signatures considered are then adapted to the information extractable from these images.

Thus, in one particular embodiment, said at least one image comprises a red-green-blue (RGB) encoded image taken in reflection or in transmission, and the method furthermore comprises a step of converting the RGB image to an L*a*b* color space, the signature of the defect containing the a* and b* components of a basic surface of the defect, which components are determined from the converted image. The signature of the defect may also furthermore contain an L* component of the defect, which is determined from the converted image.

In another embodiment, said at least one image comprises a hyperspectral image and the signature of the defect contains a spectrum representing values of a reflection coefficient of a transmission coefficient of a basic surface of the defect as a function of a wavelength. Moreover, each reference signature associated with a compartment of the deposition line may contain, in this embodiment, a plurality of spectra corresponding to various thicknesses of the layer deposited in the compartment.

These various types of RGB-encoded or hyperspectral images contain more information on the defect than grayscale-encoded images. However they require more complex and often more expensive optical inspecting systems to be used. The invention is adaptable to various types of optical inspecting system that are placed at the end of the deposition line.

In the aforementioned embodiments, a small number of characteristics representative of the defect were extracted from images of this defect and exploited. This small number of characteristics limits the complexity of the identifying step, since only a few characteristics need to be compared to the reference signatures of the compartments in this step.

In another embodiment of the invention, the identifying step comprises applying a machine learning method to the signature of the defect, said learning method being based on a model trained using reference signatures associated with the compartments of the deposition line.

The model is preferably trained on a large number of images representing defects the origin of which it is possible to identify or the origin of which is known, these images having being obtained over a number of production days. Such a model for example consists of one or more decision trees trained using compartment reference signatures extracted from the large number of images. Thus, the machine learning method used in the identifying step may for example be a random decision forest algorithm able to use such decision trees. However, any other algorithm allowing elements to be classified together and based on a model trained using reference values may be used as a variant (e.g. a nearest neighbor algorithm, a support vector machine (SVM) algorithm, a neural network algorithm, etc.).

In this embodiment, noteworthy characteristics of the defect other than those mentioned above may be easily extracted from the digital images and exploited to identify the compartment in which the defect originated. Preferably, the signature of the defect, i.e. the signature determined from said at least one image, contains at least one characteristic relating to the luminous intensity of the defect and/or one characteristic relating to a shape of the defect.

By way of example, said at least one characteristic relating to the luminous intensity of the defect may comprise:

characteristics representative of a radial luminous-intensity profile of the defect; and/or characteristics representative of a slope of a radial luminous-intensity profile of the defect; and/or a characteristic representative of an average luminous intensity of the defect; and/or a characteristic representative of a luminous intensity at the center of the defect.

Similarly, said at least one characteristic relating to a shape of the defect may comprise:

a characteristic representative of an area of the defect; and/or a characteristic representative of a ratio of a perimeter of the defect to an area of the defect; and/or a characteristic representative of an aspect ratio of the defect.

The aforementioned characteristics have been identified by the inventors as allowing, when all or some thereof are used, the compartment that was the origin of the defect to be very reliably identified. It should be noted that use of a machine learning method allows a larger number of defect characteristics to be more easily taken into account.

It should be noted that in all the embodiments of the invention described above, the correspondences between the reference signatures and the compartments are liable to vary, and in particular depend on the configuration of the deposition line, during the deposition of thin layers on the substrate. Specifically, there may be cause for the contribution of each cathode to the thickness of the stack to be changed, in particular by changing the power applied to the cathode, the run rate of the substrate facing the cathode, the pressure of the gas used in the compartment of the cathode and its composition, etc. This dependency with respect to the deposition parameters may easily be taken into account empirically or analytically, and in particular using a mathematical model relating the deposition parameters to the thickness of the corresponding stack in each compartment.

In one particular embodiment, the various steps of the locating method are determined by computer program instructions.

Therefore, the invention also relates to a computer program on a recording or information medium, it being possible to implement this program in a locating device or more generally in a computer, this program including instructions suitable for implementing steps of a locating method such as described above.

This program may use any programming language, and take the form of source code, object code or of code intermediate between source code and object code, such as in a partially compiled form, or in any other desirable form.

The invention also relates to a computer-readable recording or information medium containing the instructions of a computer program such as mentioned above.

The recording or information medium may be any entity or device capable of storing the program. For example, the medium may include a storage medium, such as a ROM, for example a CD-ROM or a microelectronic-circuit ROM, or even a magnetic recording means, for example a floppy disk or a hard disk.

Furthermore, the recording or information medium may be a transmissible medium such as an optical or electronic signal, which may be transported via an optical or electrical cable, by radio or by other means. The program according to the invention may in particular be downloaded from a network such as the Internet.

Alternatively, the recording or information medium may be an integrated circuit into which the program is incorporated, the circuit being suitable for executing or for being used in the execution of the method in question.

The invention also relates to a system comprising:

a deposition line comprising a succession of compartments able to deposit a stack of thin layers on a substrate, in which each thin layer of a material is deposited in one or more successive compartments of the deposition line and pieces of debris remaining on the surface of a thin layer deposited in a compartment act as masks for the subsequent depositions of thin layers and are the origin of defects;

at least one optical inspecting system placed at the end of the deposition line and configured to deliver at least one image showing a defect affecting the stack of thin layers deposited on the substrate; and a locating device according to the invention, able to identify, among the succession of compartments of the deposition line, at least one compartment liable to be the origin of the defect.

It is also possible to envision, in other embodiments, the locating method, the locating device and the system according to the invention having, in combination, all or some of the aforementioned features.

BRIEF DESCRIPTION OF THE DRAWINGS

Other features and advantages of the present invention will become apparent from the description given below, with reference to the appended drawings, which illustrate one exemplary embodiment thereof, which embodiment is completely nonlimiting. In the figures.

DETAILED DESCRIPTION OF THE INVENTION

Figure 1:
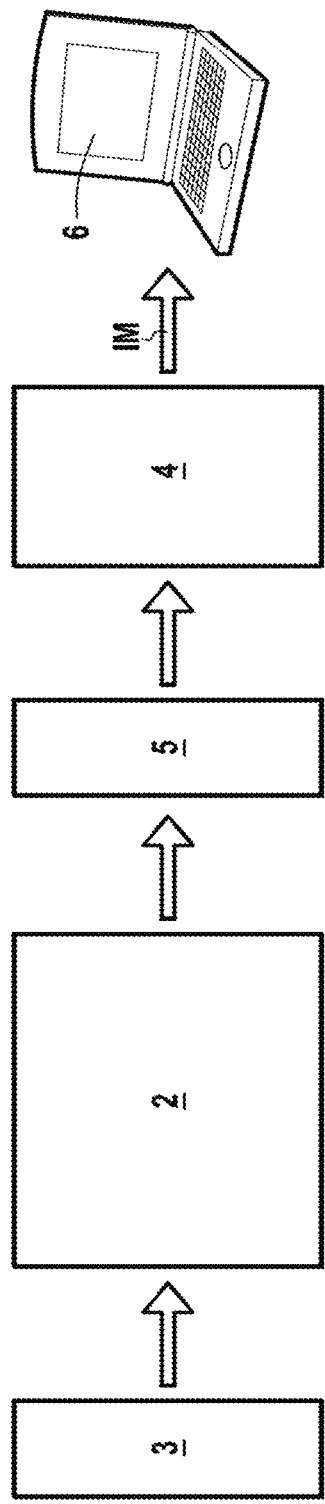
FIG. 1 shows, schematically, a system according to the invention, in one particular embodiment.

FIG. 1 shows, in its environment, a system 1 according to the invention, in one particular embodiment.

The system 1 includes:

a deposition line 2 allowing a stack of thin layers to be deposited on a transparent substrate 3;

an optical inspecting system 4 placed at the end of the deposition line 2, and able to acquire various digital images of the transparent substrate coated with the stack of thin layers (which substrate is referenced 5), and to detect from these images the presence of defects affecting the coated substrate 5; and a locating device 6 according to the invention, which is able to analyze the digital images IM of the defects detected by the optical inspecting system 4 with a view to locating their origin in the deposition line 2.

In the examples envisioned below, the stack of thin layers is deposited on a glass substrate 3 and forms an interferential system. In these examples, the stack of thin layers comprises one or more functional layers with reflective properties in the infrared (namely one or two silver layers in the examples 1 and 2, and an indium tin oxide (ITO) layer in the example 3), and coatings formed from one or more thin layers, which coatings are located on either side of each functional layer and form the interferential system. Below, the term "module" (M1, M2, M3) designates each of the coatings that flank the one or more silver or ITO functional layers, it being understood that a module may consist of a single thin layer or of a plurality of thin layers.

Of course, the examples described below are not limiting per se and other stacks of thin layers and other in particular transparent substrates (e.g. rigid or flexible substrates made of organic polymeric material) may be envisioned.

In the examples below, the coatings or "modules", which flank the one or more functional layers, consist of thin layers based on dielectric materials (e.g. thin layers of oxide, nitride or oxynitride). As a variant, in particular in the case where thin metal layers are used by way of functional layers, each module that is placed above, in the direction of deposition of the stack, a thin metal layer may comprise, by way of layer subjacent to the thin metal layer, a thin metal over-blocker layer, which may optionally be oxidized, intended to protect the thin metal layer during the deposition of a subsequent layer, for example if the latter is deposited under a nitriding or oxidizing atmosphere, and during any subsequent heat treatment. Each thin metal layer may also be deposited on and in contact with a thin metal under-blocker layer. The stack of thin layers may therefore comprise an over-blocker layer and/or an under-blocker layer flanking the or each thin metal layer. These blocker layers, which are very thin layers, normally of a thickness smaller than 1 nm in order not to affect the light transmittance of the stack, play the role of sacrificial layers, in particular capable of capturing oxygen.

In the embodiment illustrated in FIG. 1, the deposition of thin layers is carried out by the deposition line 2 on the glass substrate 3 by means of a magnetron cathode sputtering technique.

As is known, cathode sputtering techniques are based on the condensation in a rarefied atmosphere of a vapor of a target material issued from a sputtering source on a substrate. More precisely, the atoms of the source (also called a target) are ejected into an ionized gas, such as ionized argon for example, in a vacuum chamber maintained at a certain pressure. An electric field is created leading to the ionization of the gas and thus forming a plasma. The target is lowered to a negative (cathode) potential so that the ions present in the plasma are attracted by the target and eject atoms therefrom. The particles thus sputtered are scattered through the chamber and certain thereof in particular collect on the substrate, on which they form a thin layer. In the case of a magnetron cathode, a magnetic field oriented perpendicularly to the electric field is furthermore created by magnets placed in proximity to the cathode so as to confine the electrons in the vicinity of the cathode. This makes it possible to increase the degree of ionization of the gas, and thus to substantially improve the deposition yield in comparison to a conventional cathode sputtering technique. Since cathode sputtering techniques are well known to those skilled in the art, they will not be described in more detail here.

Figure 2:
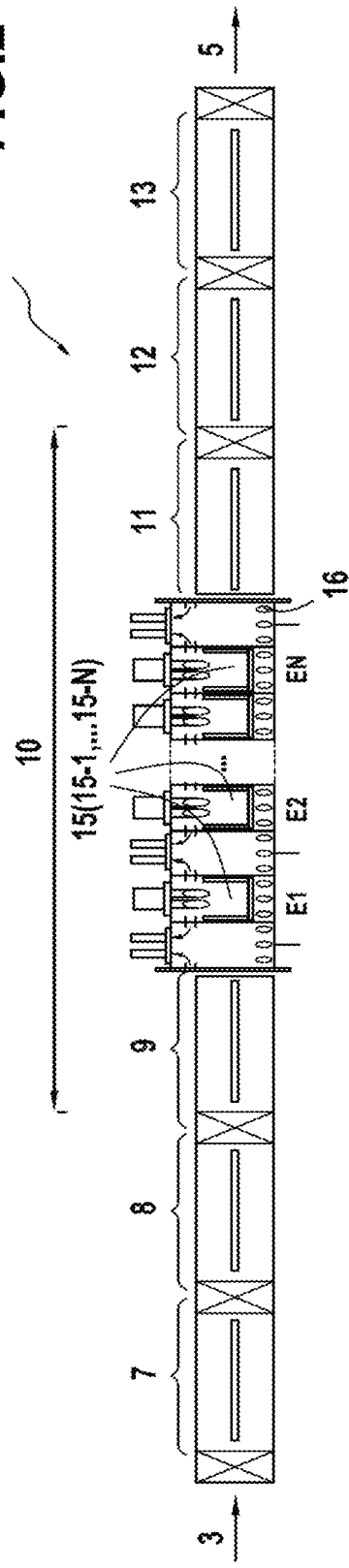
FIG. 2 shows a deposition line of a stack of thin layers, which line is part of the system of FIG. 1.

FIG. 2 schematically shows the deposition line 2 used to deposit thin layers by cathode sputtering on the glass substrate 3. It here comprises an entrance chamber 7, a first buffer chamber 8, a magnetron cathode sputtering chamber 10 comprising a first transfer section 9 and a second transfer section 11, a second buffer chamber 12 and an exit chamber 13.

The cathode sputtering chamber 10 comprises, apart from the two transfer sections 9 and 11, a succession of elements $E_i$, i=1, ..., N where N is an integer. Each element $E_i$ comprises a deposition chamber or compartment 15-$i$ containing a cathode used as target during the magnetron cathode sputtering, and one or two pumping chambers or compartments equipped with a pump, said pumping chambers or compartments being located, if needs be, on either side of the deposition chamber in order to create the vacuum therein. The glass substrate 3 is passed through the various successive compartments of the cathode sputtering chamber 10 by means of a conveyor or conveyor belt 16.

The succession of the various elements $E_i$, i=1, ..., N allows a stack of thin layers to be deposited on the glass substrate 3. It should be noted that a plurality of successive compartments 15-$i$ may participate in the deposition of a single layer of a given material, in predefined proportions. The configuration of the various compartments 15-$i$ in which the depositions of thin layers take place consists in adjusting various parameters of the magnetron cathode sputtering, and, in particular, the pressure of the gas and its composition, the power applied to the cathode, the angle of incidence of the bombarding particles, the thickness of the deposition, etc.

Figure 3:
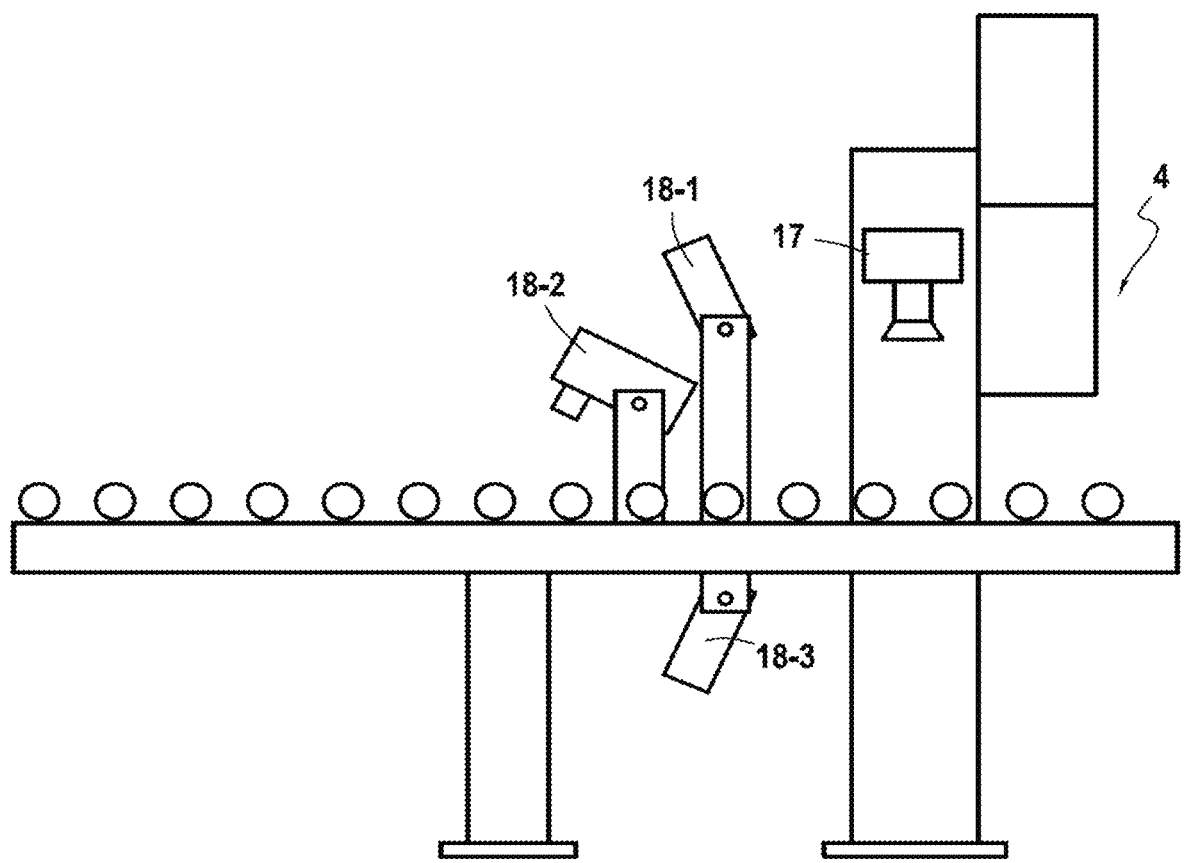
FIG. 3 shows an optical inspecting system placed at the end of the deposition line in the system of FIG. 1.

The optical inspecting system 4 is placed at the end of the deposition line 2. As schematically illustrated in FIG. 3, it is equipped with one or more video cameras 17 and a plurality of radiation sources 18 allowing various types of digital images of the coating substrate 5 output from the deposition line to be acquired and generated. In the example envisioned in FIG. 3, the optical inspecting system 4 comprises three radiation sources 18, namely a reflection dark field (RDF) light source 18-1, a reflection bright field (RBF) light source 18-2 and a transmission bright field (TBF) light source 18-3. These light sources are turned on then turned off in alternation in order to acquire various configurations of digital images, taken in reflection (corresponding to the reflection of the light source from the coated substrate) and/or in transmission (corresponding to the light generated by the light source and transmitted through the coated substrate), showing potential defects affecting the coated substrate 5 including the stack of thin layers.

The nature of the video cameras 17, of the resulting digital images, and the configuration of the radiation sources is in no way limited. Thus, depending on their nature and their capacities, the video cameras may for example deliver grayscale-encoded digital images, red-green-blue (RGB) encoded trichromic images, or it may even be a question of hyperspectral video cameras able to deliver hyperspectral images, etc. Moreover, radiation sources operating in the visible domain or in other wavelength domains, such as for example in the infrared domain, may be used by the optical inspecting system 4. These radiation sources may be oriented at various angles depending on the images that it is desired to acquire and use to locate the one or more compartments that were the origin of the defect.

Figure 6:
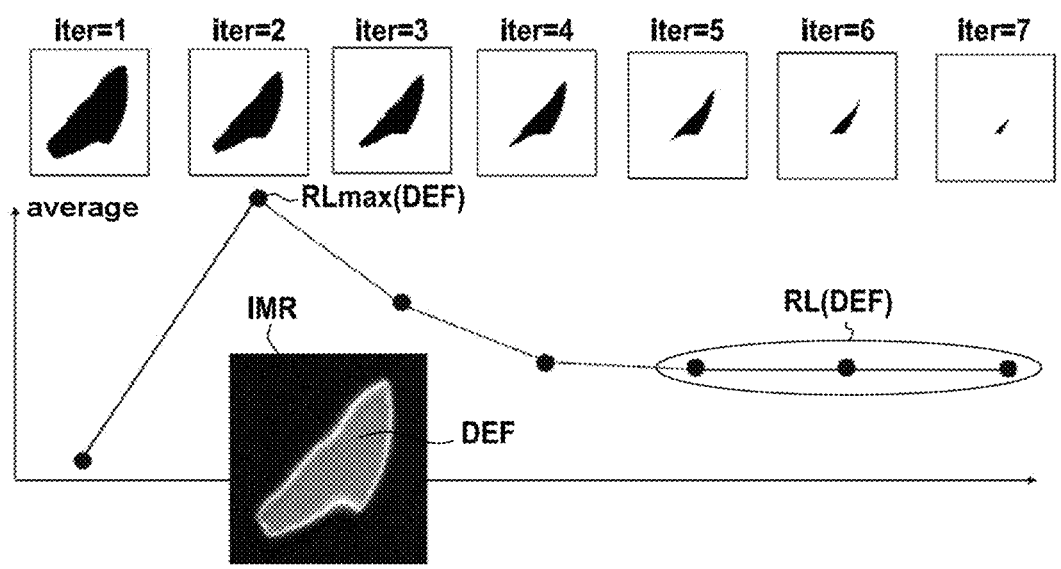
FIG. 6 shows a successive erosion method able to be applied to an image of a defect affecting a stack of thin layers in order to determine the signature of this defect in one particular embodiment.

The bottom part of FIG. 6 shows, by way of illustration, a grayscale-encoded digital image taken in reflection, which image was acquired using an RBF light source operating in the visible domain. The blemish appearing on this image reflects a defect detected by the optical inspecting system 4. In this image, the contrast measured by the video camera of the optical inspecting system 4 is proportional to the light reflectance of the defect. It will be noted that when the image is not hyperspectral, as is the case here, the invention is based on the assumption that the contrast value considered, i.e. that extracted from the images delivered by the optical inspecting system, expresses the true value of the integrated quantity (RL or TL) that would be extracted from a spectral response (absolutely or relatively).

Such an optical inspecting system is known per se and conventionally used to detect defects affecting the depositions carried out in a deposition line such as the deposition line 2. It is therefore not described in more detail here. It will be noted that the invention is not limited to the use of a single optical inspecting system and it may be envisioned for the images processed by the locating device according to the invention to come from a plurality of optical inspecting systems placed at the end of the deposition line.

As mentioned above, the defects affecting the coated substrate may in particular be due to pieces of dust or debris present in certain compartments 15-$i$ of the cathode sputtering chamber 10 and that fall erratically onto the substrate as the latter passes through these compartments. Very advantageously, by exploiting the images of defects detected on coated substrates 5 output from the deposition line 2, the locating device 6 according to the invention is capable of locating the compartment 15-$i$ of the deposition line 2 in which this defect originated.

Figure 4:
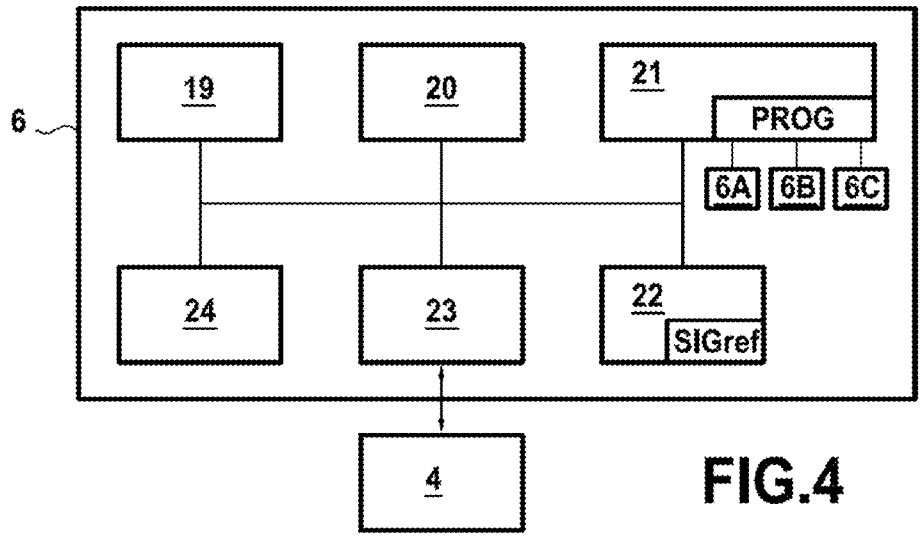
FIG. 4 schematically shows the hardware architecture of a locating device according to the invention, which device is part of the system of FIG. 1, in one particular embodiment.

In the embodiment described here, the locating device 6 is a computer the hardware architecture of which is schematically shown in FIG. 4. It comprises a processor 19, a random-access memory 20, a read-only memory 21, a nonvolatile memory 22, a communicating module 23 and various input/output modules 24.

The communicating module 23 makes it possible for the locating device 6 to obtain the images of defects acquired by the optical inspecting system 4. It may in particular comprise a digital data bus and/or means for communicating over a (local or remote) network such as for example a network card, etc., depending on the way in which the optical inspecting system 4 and the locating device 6 are connected to each other.

The input/output modules 24 of the locating device 6 in particular comprise a keyboard, a mouse, a screen, and/or any other means (e.g. a graphic interface) allowing the locating device 6 to be configured and the results of the analysis that it performs on the images of defects that are provided thereto to be accessed.

The read-only memory 21 of the locating device 6 is a recording medium according to the invention, readable by the processor 19 and on which a computer program PROG according to the invention is recorded, this program including instructions for executing steps of a locating method according to the invention.

This computer program PROG defines equivalently software and functional modules that are here configured to implement the steps of the locating method according to the invention. These functional modules employ or control the aforementioned hardware elements 19 to 24. They in particular comprise here:

a module 6A for obtaining at least one image showing a defect, which image is acquired by the optical inspecting system 4, this module 6A being able to communicate with and control the communicating module 23;
a module 6B for determining, from said at least one image, a signature of the defect containing at least one characteristic representative of the defect; and
a module 6C for identifying at least one compartment liable to be the origin of the defect, which is configured to use the signature of the defect and a plurality of reference signatures associated with the compartments of the deposition line.

The functions of these modules are described in more detail below with reference to FIGS. 5 to 16, in four distinct embodiments of the invention. The three first embodiments differ in the nature of the digital images that are delivered by the optical inspecting system 4 and analyzed by the locating device 6 to locate the origin of a defect. Thus, in the first embodiment, the images used by the locating device 6 are grayscale-encoded digital images; in the second embodiment, it is a question of trichromic (or RGB for red-green-blue) digital images, and in the third embodiment, the images delivered by the optical inspecting system are hyperspectral images. In the fourth embodiment, the locating device 6 implements an alternative type of processing with respect to the three first embodiments to locate the defect in the deposition line 2. These four embodiments of the invention however employ the same main steps to locate the defect, namely:
a step of obtaining one or more images showing said defect and acquired by the optical inspecting system 4;
a step of determining, from these images, a signature of the defect, containing at least one characteristic representative of the defect; and
a step of identifying, among the 15-$i$, i=1, ..., N, compartments of the deposition line, at least one compartment liable to be the origin of the defect, from the signature of the defect and using the reference signatures associated with the 15-$i$, i=1, ..., N compartments.

We will now describe in more detail these steps in each of the embodiments. To illustrate these various embodiments, the three following examples of stacks of thin layers will be considered.

Example 1 the stack is deposited on a substrate made of soda-lime-silica glass and comprises, in the direction of deposition of the stack on the substrate:
a first coating or module M1 formed by a plurality of thin layers based on dielectric materials (e.g. layers of oxide, nitride or oxynitride);
a thin silver layer; and
a second coating or module M2 formed by a plurality of thin layers based on dielectric materials (e.g. layers of oxide, nitride or oxynitride);
each layer of the stack is depositable by a plurality of distinct cathodes in order to obtain the required thickness, and the geometric thicknesses of the thin layers of the stack are chosen such that the whole stack forms an interferential system.

Example 2 the stack is deposited on a substrate made of soda-lime-silica glass and comprises two thin silver layers flanked by thin layers of $Si_3N_4$, with the following thicknesses:

| Material | Thickness (nm) |
|---|---|
| $Si_3N_4$ (M3) | 30 |
| Ag (L2) | 20 |
| $Si_3N_4$ (M2) | 75 |
| Ag (L1) | 7 |
| $Si_3N_4$ (M1) | 41 |

The geometric thicknesses of the thin layers of the stack are chosen such that the whole stack forms an interferential system. In example 2, various thin layers of a given material ($Si_3N_4$ or Ag) are deposited on the substrate with various thicknesses. The layer that is being referred to is then indicated between parentheses, for example Ag (L1) designates the first silver layer deposited and Ag (L2) the second silver layer. In example 2, "module M1" refers to the thin layer of $Si_3N_4$ deposited on the substrate before the first silver layer Ag (L1), "module M2" to the thin layer of $Si_3N_4$ deposited between the first silver layer Ag (L1) and the second silver layer Ag (L2), and "module M3" to the thin layer of $Si_3N_4$ deposited after the second silver layer Ag (L2).

Example 3 the stack is deposited on a substrate made of soda-lime-silica glass and comprises a thin indium tin oxide (ITO) layer flanked by coatings or modules M1, M2 based on dielectric materials, with the following thicknesses:

| Material | Thickness (mm) |
|---|---|
| $TiO_2$ | 12 |
| $SiO_2$ (L2) | 40 |
| ITO | 100 |
| $SiO_2$ (L1) | 11 |
| SiN | 16.5 |

The geometric thicknesses of the thin layers of the stack are chosen such that the whole stack forms an interferential system. In example 3, various thin layers of a given material are deposited on the substrate with various thicknesses. The layer that is being referred to is then indicated between parentheses. In example 3, "module M1" refers to the coating formed by the thin layers of SiN and $SiO_2$ (L1) that are deposited on the substrate before the ITO layer, and "module M2" to the coating formed by the thin layers of $SiO_2$ (L2) and $TiO_2$ that are deposited on the substrate after the ITO layer.

Of course, these examples are given merely by way of illustration and in no way limit the invention. As mentioned above, the invention is applicable to various stacks of thin layers capable of being deposited on a substrate, and in particular to stacks forming an interferential system.

It is assumed in the embodiments described below that a defect has been detected by virtue of the images acquired by the optical inspecting system 4. The way in which this defect is detected is known per se and not described here.

Figure 5:
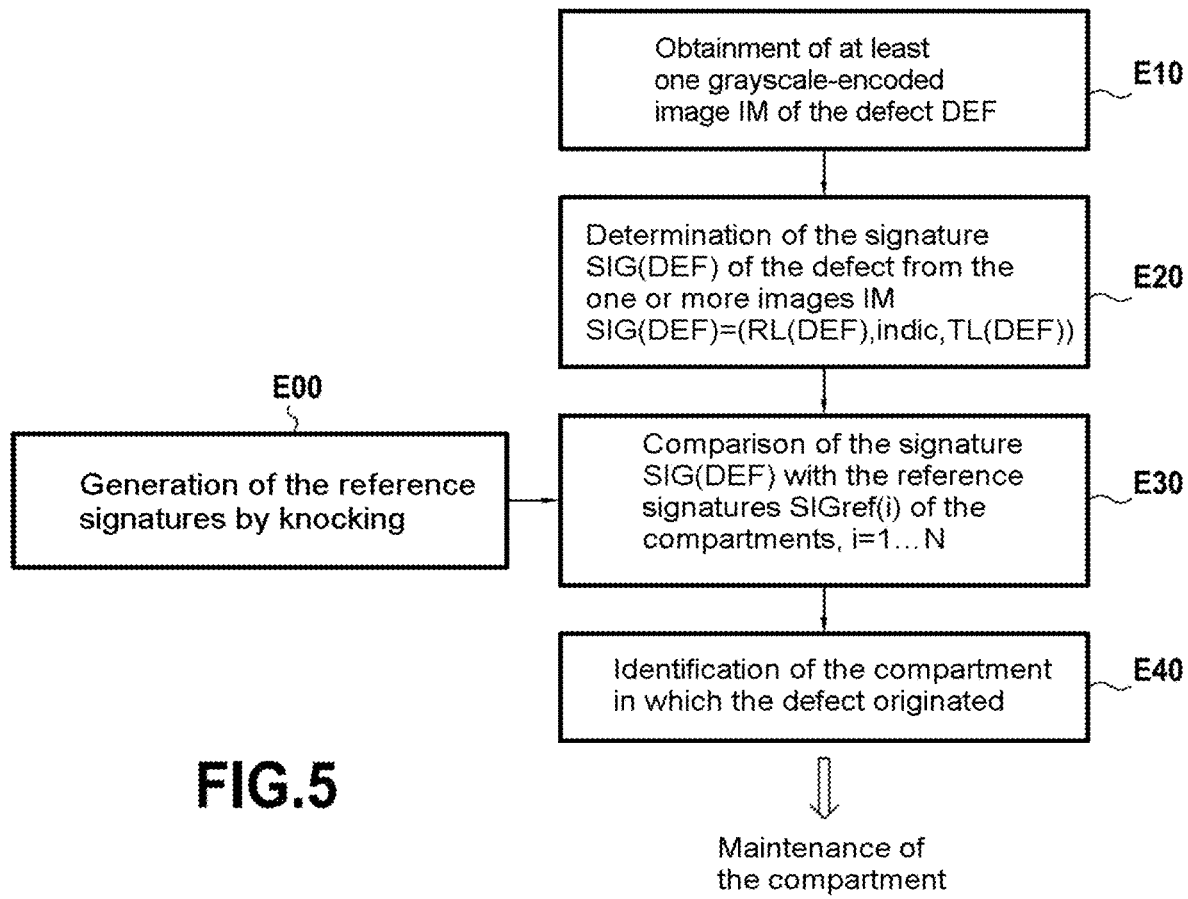
FIGS. 5, 11, 14 and 16 show, in the form of flow charts, four embodiments of the locating method according to the invention.

FIG. 5 shows the main steps of the locating method according to the invention such as it is implemented by the locating device 6 in the first embodiment.

In this first embodiment of the invention, the optical inspecting system 4 is equipped with digital video cameras suitable for delivering grayscale-encoded digital images IM of the detected defect, which images are acquired by activating all or some of the various radiation sources of the optical inspecting system 4. Such images consist of a plurality of pixels, each pixel being associated with a grayscale value expressing its lightness.

Here, the following two types of images are used: digital images taken in reflection of the defect, which images are designated by the reference IMR, acquired by activating the RBF light source 18-2 and express the reflection coefficient of the defect; and digital images taken in transmission of the defect, which images are designated by the reference IMT, acquired by activating the TBF light source 18-3 and represent a transmission coefficient of the defect. For the sake of simplicity, in the following description consideration is limited to one image IMR taken in reflection, and where appropriate, one image IMT taken in transmission.

It will be noted, as explained in more detail below, that depending on the configuration of the stack of thin layers in question, it is not necessary for the locating device 6 to systematically be able to provide two types of images.

Specifically, in the case of a stack similar to example 1, comprising a single silver layer (or a single layer of another low-emissivity material), a single image IMR taken in reflection may be enough to precisely locate the origin of the defect.

In example 2, comprising a plurality of silver layers, the use of a single image IMR taken in reflection may allow a small number of compartments liable to be the origin of a defect to be isolated but is not always enough to allow a single compartment to be identified among this small number of compartments. To remove this residual ambiguity, an image other than an image taken in reflection may be used, such as for example an image taken in transmission acquired by means of a radiation source operating in the infrared wavelength domain, or a plurality of images of the defect, such as for example one image IMR taken in reflection and one image IMT taken in transmission may be used, these images both being acquired by means of radiation sources operating in the visible wavelength domain.

Whether an image taken in reflection and/or an image taken in transmission, which image(s) are/is acquired by means of a radiation source in the visible wavelength domain and/or with other wavelengths such as wavelengths in the infrared domain, are/is used in particular depends on the absorptive and reflective properties of the considered stack of thin layers, and on the characteristics representative of the defect that are used to implement the invention. This is illustrated further below with reference to the given examples.

It is assumed that the locating device 6 obtains from the optical inspecting system 4 at least one grayscale-encoded image IM of the defect detected in the stack of thin layers deposited on the glass substrate 3 (step E10). This or these images IM is/are received by the locating device 6 via its communicating module 23 and its obtaining module 6A.

The locating device 6, via its determining module 6B, then determines, from the one or more images IM, a signature SIG(DEF) of the defect (step E20). By signature of the defect, what is meant in the context of the invention is one or more characteristics representative of the defect and that will allow its origin in the deposition line 2 to be located by comparing it to reference signatures associated with each of the compartments 15 of the deposition line. These characteristics may in particular depend on the nature of the images IM exploited by the locating device 6 and on information on the defect contained in these images, on the reflective and absorptive properties of the stack of thin layers deposited on the substrate, on the shape of the defect, etc.

To better illustrate this step, the stack of thin layers of example 1 described above and containing a thin silver layer flanked by two modules M1 and M2 each formed by a plurality of thin layers based on dielectric materials (e.g. layers of oxide, nitride or oxynitride) will be considered. Moreover, it is assumed that the optical inspecting system 4 delivers a single grayscale-encoded image taken in reflection IM=IMR, which image is acquired by means of the light source 18-2 operating in the visible wavelength domain.

In the embodiment described here, the determining module 6B extracts from this image IMR taken in reflection various characteristics relating to the light reflection coefficient of the defect. To this end, it applies here, to the image IMR taken in reflection, a successive erosion method allowing it to extract, during a plurality of iterations, various values of the reflection coefficient of the defect.

FIG. 6 schematically illustrates the application of this method to a defect DEF shown in an image IMR taken in reflection. This method consists, using the image IMR taken in reflection of the defect, in successively "eroding" or "removing" the defect from its outline (i.e. in each iteration iter a small thickness of the outline of the defect is removed, this thickness not necessarily being uniform from one iteration to the next) and in calculating the average of the grayscale values of the pixels in the removed area of the defect, the grayscale value of a pixel expressing the light reflection coefficient of the defect in the location represented by the pixel. The area remaining after each erosion is shown, by way of illustration, in FIG. 6, in boxes associated with each iteration (iter=1, iter=2, . . . , iter=7). The number of iterations and the erosion increment applied in each iteration (for example 1 pixel) used to implement this successive erosion method are chosen consistently with the shape of the defect in order to allow relevant information to be extracted from this defect.

In the example illustrated in FIG. 6, the defect shown is a blemish encircled by a light ring. In the first iteration (iter=1), the eroded surface used to calculate the average of the grayscale values of the pixels intentionally includes only a "black" portion of the background of the image, which is located beyond the defect and encircling the latter. As a result, a relatively low average grayscale value is obtained (because only the very low grayscale values representing the black area encircling the defect are taken into account).

In the second iteration (iter=2), the eroded portion of the defect corresponds to the light ring encircling the defect. Since this light ring corresponds to high grayscale values, the resulting light reflection coefficient is maximum.

Next, the erosion continues and the average of the light reflection coefficients decreases before stabilizing in the example shown from the fourth iteration onward (iter=4). The "stabilized" value of the average in the last iterations gives the value of the light reflection coefficient of the defect, which value is denoted RL(DEF). The presence of a maximum, here in the second iteration, which maximum is denoted RLmax(DEF), and the peak shape of the averages of the grayscale values illustrate the presence of a clear ring around the defect. The erosion method thus described therefore allows the presence of a light ring on the perimeter of the defect to be easily identified. It will be noted that in the absence of a light ring, the values of RLmax(DEF) and RL(DEF) are substantially the same.

In the first embodiment described here, the value of the light reflection coefficient RL(DEF) is a characteristic that is used by the determining module 6B to determine the signature of the defect. The light reflection coefficient RL(DEF) considered in the signature is preferably normalized, for example by the light reflection coefficient of the coated substrate 5 output from the deposition line 2 (final product)

or by the light reflection coefficient of the bare glass (average contrast). Such a normalization advantageously allows drift in the calibration of the various video cameras of the optical inspecting system to be accommodated. It is however optional. In the rest of the description, it is thus immaterial whether normalized or non-normalized reflection and/or transmission coefficients are considered as the invention applies in the same way to both these cases.

The determining module 6B also adds to the signature of the defect an indicator of the presence or absence of a light ring around the defect, which ring is detected, as indicated above, on the basis of the value RLmax(DEF).

As a variant, techniques other than a successive erosion method may be used by the determining module 6B to determine the signature of the defect and to detect the presence or absence of a light ring around said defect. For example, the determining module 6B may determine a luminous intensity profile of the defect by evaluating the light reflection coefficient at various points of a diagonal of the defect (e.g. the largest diagonal or in contrast the smallest diagonal). The analysis of the various values thus obtained of the luminous intensity profile of the defect allows the determining module 6B to detect the possible presence of a light ring around the defect and to evaluate the average value of the light reflection coefficient of the defect.

According to yet another variant, intensity profiles may be determined by the determining module 6B on a plurality of radii of the defect, then averaged in order to extract therefrom the signature of the defect.

Next, the signature, of the defect, thus obtained is compared by the identifying module 6C of the locating device 6 to a plurality of reference signatures (step E30) in order to identify the one or more compartments liable to be the origin of the defect.

In the embodiment described here, the identifying module 6C uses a reference signature SIGref(i) for each distinct compartment 15-$i$, i=1, ..., N of the deposition line 2. This reference signature contains the same characteristics (i.e. the same types of characteristics) as the signature of the defect. The reference signature may contain a single value (i.e. a single point) for each characteristic or in contrast contain an interval of values for each characteristic, or only the limits or a few significant values of such an interval of values.

As a variant, a plurality of reference signatures may be associated with a given compartment.

In the first embodiment described here, the reference signatures are generated beforehand (step E00) and for example stored in the nonvolatile memory 22 of the locating device 6. As a variant, they may be stored in a remote storage space and obtained on request for example via the communicating module 23 of the locating device 6.

The reference signatures are for example generated experimentally, by knocking on each of the compartments 15-$i$, i=1, ..., N, of the deposition line 2. This procedure consists in knocking on the walls and elements of each of the compartments and in collecting the pieces of debris resulting from this knocking. Observation, using the optical inspecting system 4, of the defects thus obtained for a compartment, and analysis of the images resulting from this observation, makes it possible to estimate an average reference signature associated with the compartment and containing the same characteristics as those extracted from the defect (light reflection coefficient, presence or not of a light ring in the example envisioned here). In other words, at the end of the step E00, the locating device 6 has in memory reference signatures for each of the compartments 15-$i$ of the deposition line, these reference signatures giving for each compartment 15-$i$ an average (and where appropriate, normalized) light reflection coefficient that is what is called the reference coefficient, this coefficient being an average calculated with a plurality of defects generated by knocking on the compartment 15-$i$, and an indicator reflecting whether, on average, a light ring was present on or absent from the perimeters of defects originating from this compartment.

As a variant, the indicator of the presence or absence of a clear ring included in the reference signature of each compartment 15-$i$ may be a function of the position of the compartment 15-$i$ with respect to the compartments involved in the deposition of the silver layer. Specifically, the inventors have judiciously established a relationship between this position and the presence or absence of a clear ring around the defect: because of the high emissivity of the silver layer, the presence of a light ring around the defect in an image taken in reflection of a defect affecting a stack of thin layers comprising a single silver layer expresses the fact that the defect probably appeared before the deposition of the silver layer (i.e. in a compartment participating in the deposition of the module M1). Conversely, the absence of such a ring means that this defect probably appeared after the deposition of the silver layer (i.e. in a compartment participating in the deposition of the module M2). In the determination of the reference signatures, it is thus possible to assign directly to the compartments participating in the deposition of the layers forming the module M1 an indicator reflecting the presence of a light ring, and to the compartments participating in the deposition of the layers forming the module M2 an indicator reflecting the absence of a light ring.

It will be noted that the reference signatures thus generated depend on the configuration of the deposition line 2 and in particular of the cathode sputtering process implemented with the cathodes of the various compartments 15-$i$. Thus, said signatures in particular depend on the power applied to each cathode, on the deposition thickness needing to be deposited by each cathode, on the gas mixture in the compartment, etc. The reference signatures may be determined experimentally for each set of deposition conditions (each deposition configuration), by carrying out knocking experiments under these various conditions.

As a variant, it may be envisioned to use a mathematical model allowing one configuration to be converted to another.

Such a mathematical model is for example the following, when the reference signatures correspond to intervals of values. The way in which it may be applied to a single value will be obvious to those skilled in the art and is not described here.

The contribution of a cathode k depositing a material x on the substrate in a module y is written e(k,x,y). This contribution is here assumed to be proportional to the electrical power injected into this cathode, which is written P(k,x,y). Moreover, the total thickness of the layer of material x in the module y is written E(x,y).

To calculate the range of signatures corresponding to the cathode k, the limiting cumulative thicknesses bounding the contribution of the cathode k (i.e. corresponding to the limits of the reference signature of the cathode k) may be calculated, namely:

$$e(k-1, x, y) = E(x, y) \frac{\sum_{1}^{k-1} P(i, x, y)}{\sum_{1}^{N} P(i, x, y)} + \sum_{i=1}^{m} E(x_i, y)$$

for the lower limit; and $$e(k, x, y) = E(x, y) \frac{\sum_1^k P(i, x, y)}{\sum_1^N P(i, x, y)} + \sum_{i=1}^{x} E(x_i, y)$$

for the upper limit,
Where $$\sum_{i=1}^{m} E(x_i, y)$$

is the sum of the thicknesses of the layers deposited before the layer of material x.

If F is the function that allows, from the cumulative thickness, the reference signature of a compartment to be deduced (F is for example a vector function defining the limits of the sections of curve defining the reference signatures, or a function defining the averages of these sections of curve), then the reference signatures corresponding to the new configuration are obtained by applying the function F to the lower and upper limits e(k−1,x,y) and e(k,x,y) given above.

In one variant embodiment, the reference signatures are generated by simulation or by calculation.

Figure 7:
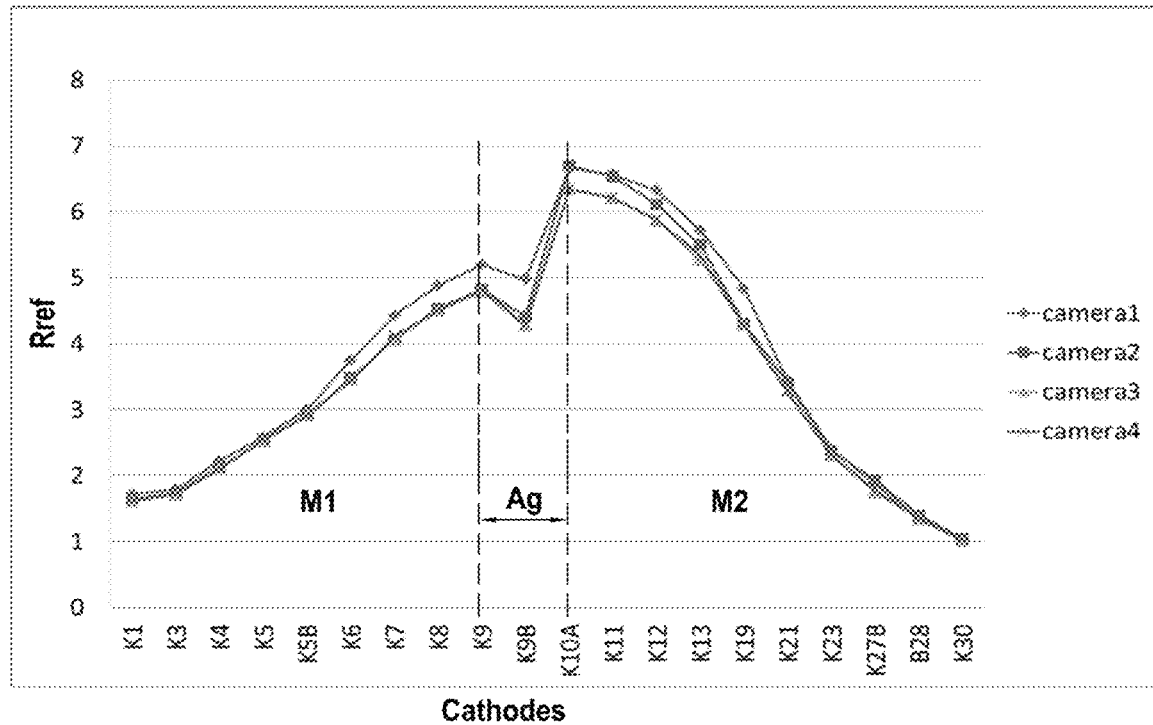
FIGS. 7, 9A-9C, 10, 12, 13 and 15 show various examples of reference signatures able to be used to identify the compartment that was the origin of a defect affecting a stack of thin layers according to the invention.

FIG. 7 illustrates an example of reference reflection coefficients Rref measured on the side of the stack and obtained by knocking, and corresponding to the deposition of a stack of thin layers according to example 1, in which deposition a plurality of cathodes identified on the x-axis (cathodes K1, K3, K4, etc.) participate, these cathodes being contained in an identical number of compartments (i.e. there is therefore an unequivocal relationship between the cathode indicated on the x-axis and a compartment of the deposition line).

In this example, the reference reflection coefficients Rref were generated from images acquired by four distinct video cameras of the optical inspecting system 4, which video cameras were placed so as to monitor various zones of the coated substrate. In the generation of the reference reflection coefficients Rref, it is possible either to estimate one reference coefficient per video camera or zone of the coated substrate, or to estimate a hybrid reference coefficient from reference coefficients obtained by each video camera, for example resulting from taking the average of the reference coefficients obtained by each video camera.

In the example illustrated in FIG. 7, a single reference reflection coefficient Rref has been determined for each cathode. As a variant, it is possible to determine, for each cathode, not a single reference reflection coefficient value but an interval comprising a plurality of possible values of the reference reflection coefficient, or in yet another variant the limits of an interval of possible values of the reference reflection coefficient.

It will be noted that in FIG. 7, the cathodes K9, K9B and K10A correspond to the cathodes involved in the deposition of the silver layer. These cathodes are known to not generate (or to generate little) pieces of debris. In other words, it is not very probable that a defect affecting the stack of thin layers will have originated in a compartment containing one of these cathodes. It will moreover be noted, in the example illustrated in FIG. 7, that certain cathodes (or equivalently certain compartments) are associated with the same reflection coefficient value (for example the cathodes K4 and K23).

The reference reflection coefficients Rref may as a variant be represented not as a function of the compartments with which they are associated but of a deposition thickness in the stack. In this case, a correspondence between the thickness of the deposition and the compartment participating in the deposition corresponding to this thickness is established and stored in the locating device 6, in its nonvolatile memory 22 for example. A given compartment may then be associated with one or more deposition thicknesses or, in other words, with one or more reference signatures.

In the first embodiment described here, the signature of the defect is compared with the reference signatures associated with the various compartments of the deposition line 2 in two substeps by the identifying module 6C.

More precisely, in a first substep, the identifying module 6C determines, from the signature SIG(DEF) of the defect, whether the latter has a light ring on its perimeter.

For the reasons given above, it is assumed here that the reference signatures associated with those compartments of the deposition line 2 which are located before the compartments containing the cathodes for depositing the silver layer (i.e. the compartments for depositing the thin layers forming the module M1, i.e. those containing the cathodes K1, K3, K4, K5, K5B, K6, K7 and K8 in the example illustrated in FIG. 7) contain, among their characteristics, an indicator reflecting the presence of a light ring on the perimeter of a defect originating in these compartments.

If the identifying module 6C detects in the signature SIG(DEF) of the defect the presence of a light ring on the perimeter of the defect, the identifying module 6C therefore associates the defect with one of the compartments participating in the formation of the module M1 (and corresponding to one of the cathodes K1, K3, K4, K5, K5B, K6, K7 and K8 in the example illustrated in FIG. 7).

If, in contrast, the signature SIG(DEF) of the defect indicates the absence of a light ring on the perimeter of the defect, the identifying module 6C associates the defect with one of those compartments of the deposition line which are located after the compartments containing the cathodes participating in the deposition of the silver layer, i.e. with one of the compartments participating in the deposition of the module M2 and containing a cathode from among the cathodes K11, K12, K13, K19, K21, K27B, K28 and K30.

Next, in a second substep, the identifying module 6C compares the reflection coefficient of the defect DEF, i.e. the coefficient contained in its signature SIG(DEF), with the reference reflection coefficients Rref contained in the reference signatures of the compartments selected beforehand (or the intervals of values or even the limits of the intervals defining the reference reflection coefficients). It then selects the compartment the reference reflection coefficient Rref of which corresponds to the reflection coefficient (or to the interval or to the limits) contained in the signature of the defect, i.e. it then selects the compartment the reference signature of which corresponds to the signature of the defect. By "corresponds to", what is meant here is the compartment the reference signature of which is most like the signature of the defect, for example in the sense of a predefined distance.

To this end, in the example illustrated in FIG. 7, in which a single reference reflection coefficient value is contained in each reference signature, the identifying module 6C selects the compartment, among all the compartments 15-i, i=1, . . . , N, of the deposition line 2, that minimizes a predefined distance, such as a Euclidean distance (also called an "L2-type distance") or a distance in absolute value (also called an "L1-type distance"). This distance is calculated between the reflection coefficient contained in the signature SIG(DEF) of the defect and the reference reflection coefficient Rref contained in the reference signature SIGref associated with the compartment in question.

It will be noted that when the reference signature does not contain a single value but rather an interval of values or limits of such an interval, the identifying module 6C may equivalently evaluate a distance of the signature of the defect to this interval or to these limits and select the compartment that minimizes this distance.

The compartment thus selected is identified by the identifying module 6C as being the compartment in which the defect DEF affecting the coated substrate 5 originated (step E40).

Following this identification, a maintenance operation may be undertaken on the identified compartment. This operation may in particular consist in cleaning this compartment, for example by knocking on its walls in order to detach therefrom the pieces of debris that are deposited thereon.

It will be noted that analysis of the digital images of the defect delivered by the optical inspecting system 4 to the locating device 6 may allow other useful information on the defect to be identified.

For example, in the step E20 of determining the signature of the defect, the determining module 6B may determine a gradient of variation in the reflection coefficient of the defect. This gradient may easily be determined from the erosion curve obtained implementing the successive erosion method or from the reflection coefficient values obtained, where appropriate, on a diagonal or on radii of the defect.

On the basis of knowledge of this gradient and its variations, the determining module 6B may deduce information on the shape of the defect. It may in particular identify that the defect is flat (or relatively flat) if the gradient is maximum over a small number of pixels (typically one pixel), or that it contains a three-dimensional protrusion if the gradient remains almost constant over a larger number of pixels.

Figure 8:
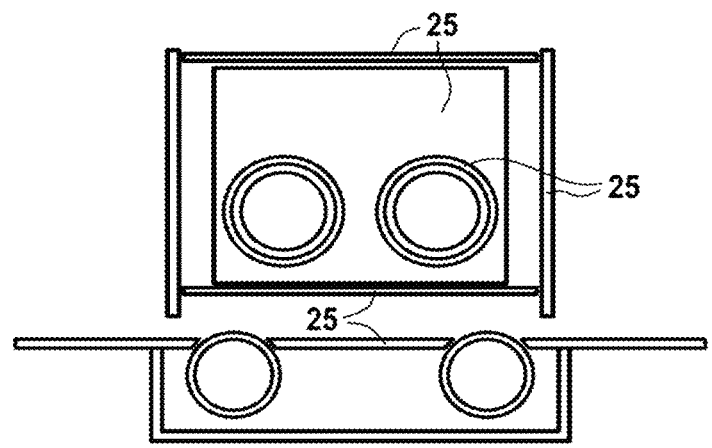
FIG. 8 illustrates a compartment containing a cathode, and the various elements protecting this cathode.

Knowledge of this information on the shape of the defect facilitates identification, in the actual compartment, of the element the was the origin of the piece of debris that created the defect, and allows the maintenance operation carried out on the compartment to be optimized. Specifically, in each compartment there exist various protective shields placed around the cathode, as illustrated in FIG. 8, by means of the reference 25. Depending on whether the pieces of debris originated from rough or flat zones of these shields, their shapes differ and they create, on the substrate, defects of different shapes. By way of illustration, a piece of debris originating from a grille-free shield placed on the ceiling of the compartment will generate a defect of flat shape. In contrast, a piece of debris originating from a horizontal shield containing a metal grille including protrusions and located in the bottom of the compartment will create a three-dimensional defect.

It will be noted that although described with reference to a grayscale-encoded image taken in reflection and acquired using a radiation source emitting radiation in the visible wavelength domain, the first embodiment that has just been described may also be implemented using a grayscale-encoded image taken in reflection and acquired using a radiation source operating in another wavelength domain (e.g. the infrared) or using a grayscale-encoded image taken in transmission and obtained using a radiation source emitting radiation in a wavelength domain suitable for the reflective and absorptive properties of the stack of thin layers in question.

In the example illustrated in FIG. 7, for a stack of thin layers according to example 1, it is enough for the locating device 6 to analyze the image IMR taken in reflection of the defect to identify in which compartment this defect originated, the uncertainty in whether the compartment is located in the series of compartments participating in the formation of the module M1 or in the series of compartments participating in the formation of the module M2 easily being removable as described above by virtue of the detection of the presence or absence of a light ring on the perimeter of the defect.

Although described with reference to a stack according to example 1, this first embodiment is applicable to other stacks of thin layers forming an interferential system, and in particular to the stack of example 3, and to other stacks comprising a single functional layer.

It may also be applied when the stack of thin layers comprises a plurality of functional layers, for example two thin silver layers as in example 2, which was introduced above.

However, for such a stack, it may prove to be necessary to take into account a plurality of images of the defect (e.g. one image taken in reflection and one image taken in transmission) if it is desired to identify more precisely the compartment in which the defect affecting the stack of thin layers originated.

Figure 9A:
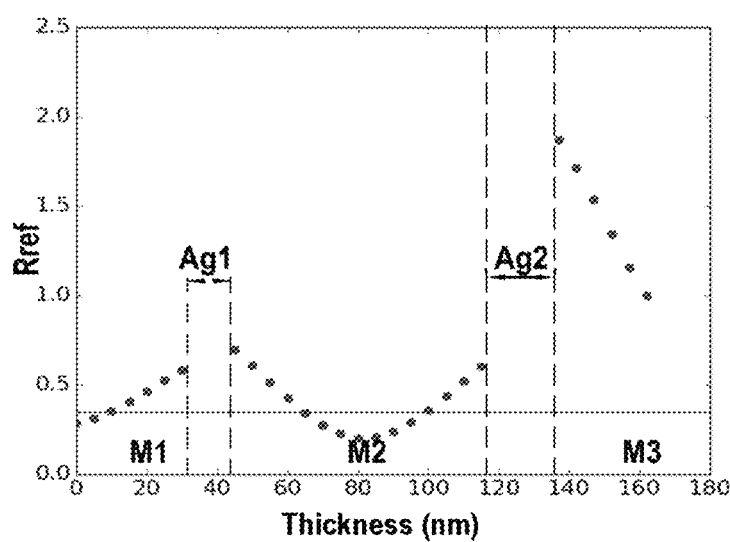

FIG. 9A illustrates an example of reference reflection coefficients Rref of compartments participating in the deposition of a stack of thin layers according to example 2. The reference reflection coefficients Rref are measured on the side of the stack and are normalized by the reflection coefficient of the coated glass substrate 5 obtained at the end of the deposition line 2. They are shown as a function of deposition thickness on the glass substrate 3, this thickness being expressed in nanometers (nm). As mentioned above, a correspondence between the thickness of the deposition and the compartment participating in the deposition of a thin layer associated with this thickness may be established beforehand and stored in the nonvolatile memory 22 of the locating device 6 in order to make it possible to identify therefrom the compartment in which the defect originated.

The reference reflection coefficients Rref of the compartments participating in the deposition of the silver layers, which compartments generate few pieces of debris, are identified in FIG. 9A by the references Ag1 (first silver layer corresponding to a deposition thickness on the substrate of between 41 nm and 48 nm) and Ag2 (second silver layer corresponding to a deposition thickness on the substrate of between 123 nm and 143 nm), respectively.

As may be seen from this figure, a reflection coefficient value equal to 0.1 may correspond to various (i.e. three) different deposition thicknesses and therefore to various compartments of the deposition line 2. As a result, if the implementation of the invention on a stack according to example 2 is limited to consideration of a defect signature consisting of a single characteristic corresponding to the reflection coefficient of the defect, the identifying step E40 may, depending on the value of this reflection coefficient, lead to a plurality of compartments being identified. In the example illustrated in FIG. 9A, the identification identifies three compartments. It will be noted that this number, although not equal to one, corresponds to a relatively small number of compartments with respect to all the compartments belonging to the deposition line, this allowing the maintenance carried out on the deposition line 2 to be simplified.

Taking into account the presence of a light ring around the defect, as described above, in the signature of the defect, may allow a defect originating from a compartment that participated in the deposition of the thin layers of the module M1 to be distinguished from a compartment that participated in the deposition of the thin layers of the module M2. However, taking this presence or absence into account may prove not to be enough to distinguish between two compartments that participated in the deposition of thin layers belonging to the same module (in the present case M2 in the example illustrated in FIG. 9A).

To palliate this insufficiency, it is possible to use, for example 2, in addition to the image IMR taken in reflection, an image IMT taken in transmission and acquired by means of a radiation source emitting in the infrared wavelength domain (for example at a wavelength of 850 nm). This radiation source may be placed in the optical inspecting system 4, by swapping it for the light source 18-3 for example, or belong to another optical inspecting system placed at the end of the deposition line 2. It may either be a wideband source covering at least some of the infrared wavelength domain, the optical inspecting system then preferably being equipped with a spectrally resolved video camera allowing an image to be acquired in the infrared, or be a spectrally resolved radiation source, the optical inspecting system then possibly being equipped with a wideband video camera or a video camera that is spectrally resolved in the infrared domain.

The determining module 6B may then extract, from this image IMT taken in transmission in the infrared domain, a transmission coefficient T(DEF) of the defect, in a similar or identical way to the one described above with respect to the extraction of the reflection coefficient of the defect from the image IMR taken in reflection. This optionally normalized transmission coefficient is used as a characteristic of the signature of the defect, in addition to the normalized reflection coefficient extracted from the image IMR. The signature SIG(DEF) of the defect therefore consists, on the one hand, of the reflection coefficient of the defect determined from the image IMR and, on the other hand, of the transmission coefficient of the defect determined from the image IMT. It is not envisioned here for the signature of the defect to contain an indicator of the presence or absence of a light ring.

Figure 9B:
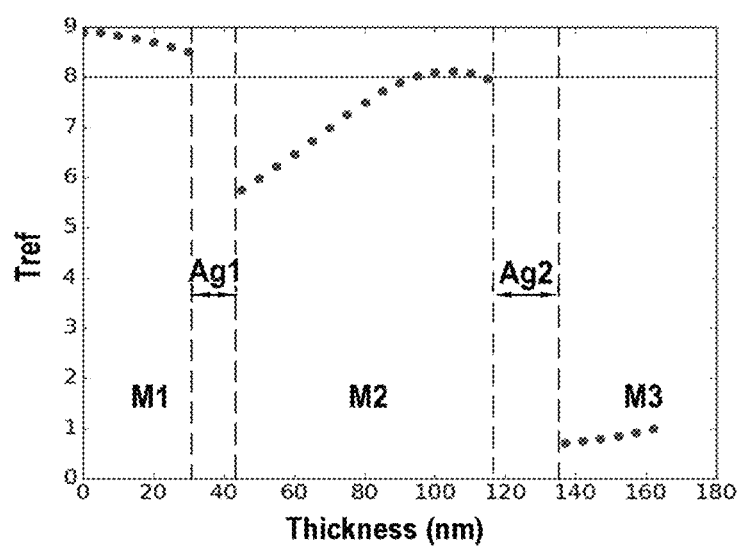

FIG. 9B illustrates the reference transmission coefficients Tref of the compartments of FIG. 9A participating in the deposition of the stack of thin layers according to example 2. These reference transmission coefficients Tref may be obtained as described above for the reference reflection coefficients Rref by knocking on each of the compartments of the deposition line 2. In the example illustrated in FIG. 9B, the reference transmission coefficients Tref are normalized by the transmission coefficient of the coated glass substrate 5 obtained at the end of the deposition line 2. They are shown as a function of deposition thickness on the glass substrate 3, which thickness is expressed in nanometers (nm). The reference transmission coefficients Tref of the compartments participating in the deposition of the silver layers are identified in FIG. 9B by the references Ag1 (first silver layer corresponding to a deposition thickness on the substrate of between 41 nm and 48 nm) and Ag2 (second silver layer corresponding to a deposition thickness on the substrate of between 123 nm and 143 nm), respectively.

As may be seen from this figure, a reference transmission coefficient Tref equal to 0.71 leads to two possible deposition thicknesses. In other words, if the signature of the defect only contained a transmission coefficient it would be possible, depending on the value of this coefficient, for two compartments to be identified as potentially being the origin of the defect.

To make it possible to obtain a more precise estimation of the location of the compartment in which the defect originated, the identifying module 6C takes into account both the reflection coefficient of the defect and the transmission coefficient of the defect i.e. the coefficients contained in the signature of the defect determined by the determining module 6B. Each reference signature then, similarly, consists of a reference reflection coefficient value Rref and of a reference transmission coefficient value Tref.

Figure 9C:
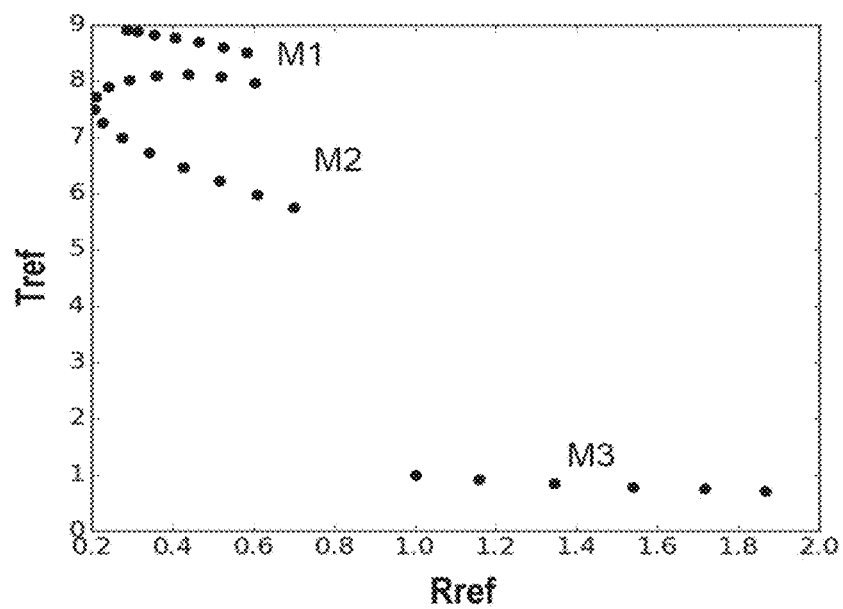

FIG. 9C illustrates, for various deposition thicknesses (the same as those considered in FIGS. 9A and 9B), the reference reflection coefficient Rref (on the x-axis) as a function of the reference transmission coefficient Tref belonging to the same reference signature. It may be seen from FIG. 9C that all the reference signatures corresponding to the various envisioned deposition thicknesses are distinct.

In other words, comparing a defect signature SIG(DEF) consisting of the reflection coefficient of the defect and of the transmission coefficient of the defect with the reference signatures associated with the compartments allows the identifying module 6C to identify a single compartment in which the defect originated. This compartment is associated with the reference signature closest to the signature of the defect, i.e. the reference signature minimizing a predefined distance, such as for example the Euclidean distance between the two vectors corresponding to the compared signatures, each vector having as components a reflection coefficient and a transmission coefficient.

However, it is not obligatory for the signature of the defect and the reference signatures to contain a plurality of characteristics in the case of a stack such as the stack of example 2. Specifically, the inventors have observed that using an image taken in transmission and acquired at a wavelength that is judiciously chosen in the infrared domain with respect to the reflective and absorptive properties of the stack, it is possible, on the basis of a signature comprising a single characteristic defined from a transmission coefficient, of the defect, extracted from this image, to precisely identify the compartment in which the defect originated.

Figure 10:
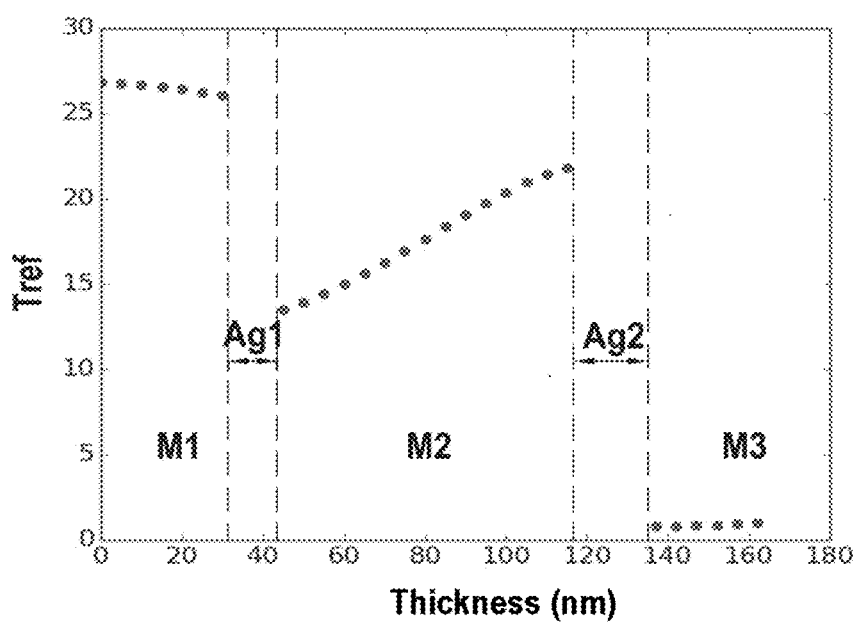

FIG. 10 illustrates an example of normalized reference transmission coefficients Tref participating in the deposition of a stack of thin layers according to example 2 and extracted from images taken in transmission of defects resulting from knocking on the compartments. In the example of FIG. 10, the images taken in transmission in question were acquired by means of a radiation source operating at a wavelength of 1050 nm and therefore belonging to the infrared domain.

It may be seen from this figure that these reference transmission coefficients Tref are all distinct as a function of deposition thickness. In other words, comparing a effect signature consisting of a single transmission coefficient extracted from an image taken in transmission acquired at the same wavelength of 1050 nm allows the compartment in which the defect originated to be uniquely identified.

In the first embodiment just described, the optical inspecting system 4 delivers to the locating device 6 grayscale-encoded digital images, and the locating device 6 exploits various pieces of information contained in these images in order to determine the origin of a defect affecting the stack of thin layers produced by the deposition line 2. The invention however applies to other types of images, such as now described in the second and third embodiments.

Figure 11:
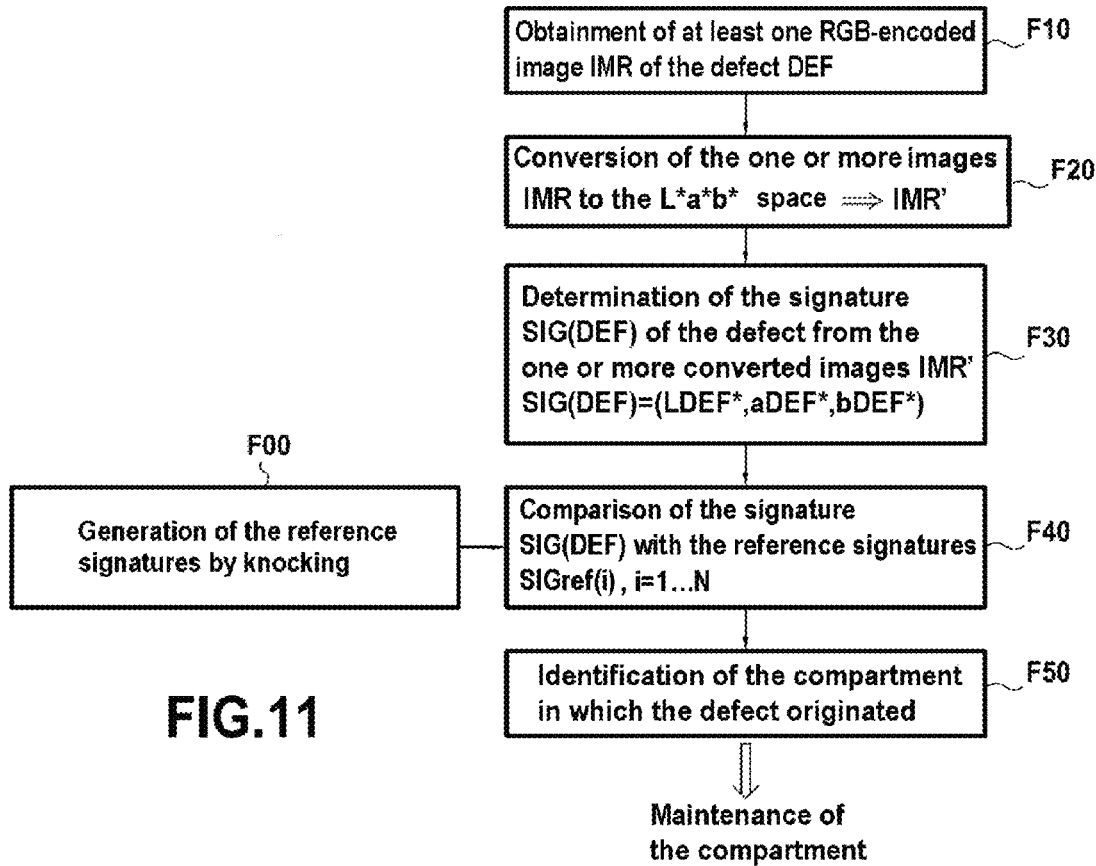

FIG. 11 shows the main steps of the locating method according to the invention such as it is implemented by the locating device 6 in the second embodiment.

In this second embodiment of the invention, the optical inspecting system 4 is equipped with color video cameras and delivers red-green-blue (RGB) encoded trichromic digital images. By RGB images, what is preferably meant here is images encoded according to the sRGB standard. As it is known per se, in RGB encoding, each point or pixel of the image is encoded by means of three quantities respectively indicating the intensity of each of the primary colors red, green and blue at this point.

The second embodiment uses RGB-encoded images of the defect that are acquired by the inspecting system 4 by activating the RBF light source 18-2; these images depict a reflection coefficient of the defect detected on the coated substrate 5, seen from the side of the stack. For the sake of simplicity, in the following description, consideration is limited to one image IMR of the defect, taken in reflection. However, a similar approach may be applied to an image taken in transmission.

The locating device 6 obtains, from the optical inspecting system 4, the RGB-encoded image IMR taken in reflection of the defect detected on the stack of thin layers deposited on the glass substrate 3 (step F10). This image IMR is received by the locating device 6 via its communicating module 23 and its obtaining module 6A.

In the second embodiment described here, before the reference signature of the defect DEF is extracted from the received image IMR, the locating device 6 converts this image to a color space other than the RGB space (step F20). More precisely, it converts the image IMR to the a*b*L* color space known to those skilled in the art. In this color space, L* represents lightness, and the a* and b* components characterize how much the color of the point in question differs from that of a gray surface of the same lightness. It will be noted that in this color space, L* corresponds more or less to the amount of light reflected by the defect.

The image is here converted in two substeps by the locating device 6: in a first substep it converts the RGB-encoded image IMR to an X,Y,Z color space, for example as described in detail on the website http://www.brucelindbloom.com/index.html?Equations.html. It then converts the image obtained in the (X, Y, Z) color space to the (L*,a*,b*) color space, as indicated in detail on the aforementioned website or on the site https://fr.wikipedia.org/wiki/CIE_L*a*b*_Conversions_CIE_XYZ_vers_CIE_L.2Aa.2Ab.2A.

Following this conversion, the locating device 6, via its determining module 6B, determines, from the converted image (referenced IMR'), the signature SIG(DEF) of the defect (step F30). To this end, it extracts from the converted image IMR' the coordinates of the a* and b* components of a basic surface of the defect. To this end, it may use a successive erosion method as described above. These coordinates will be referenced aDEF* and bDEF*.

Next, the signature of the defect thus obtained, containing the components aDEF* and bDEF*, is compared by the identifying module 6C of the locating device 6 to a plurality of reference signatures (step F40), each reference signature SIGref(i) being based on the same characteristics as the signature of the defect and being associated with one compartment 15-$i$, $i=1, \ldots, N$, of the deposition line 2, or with a deposition thickness itself associated with one compartment.

The reference signatures may be generated beforehand and stored for example in the nonvolatile memory 22 of the locating device 6. As a variant, they may be stored in a remote storage space and be obtained on request for example via the communicating module 23 of the locating device 6.

As in the first embodiment, the reference signatures may be generated from a knocking experiment, carried out beforehand on the compartments of the deposition line 2 (step F00). Observation, using the optical inspecting system 4, of the pieces of debris generated in each compartment, and in particular of RGB-encoded images taken in reflection of these pieces of debris, allows on-average reference coordinates aref*(i) and bref*(i) to be obtained for each compartment 15-$i$, $i=1, \ldots, N$, or for various deposition thicknesses associated with the various compartments. It will be noted, as mentioned above for the first embodiment, that the correspondences between the reference signatures and the various compartments depend on the configuration of the deposition line 2 and in particular on the cathode sputtering parameters in the various compartments 15-$i$.

Figure 12:
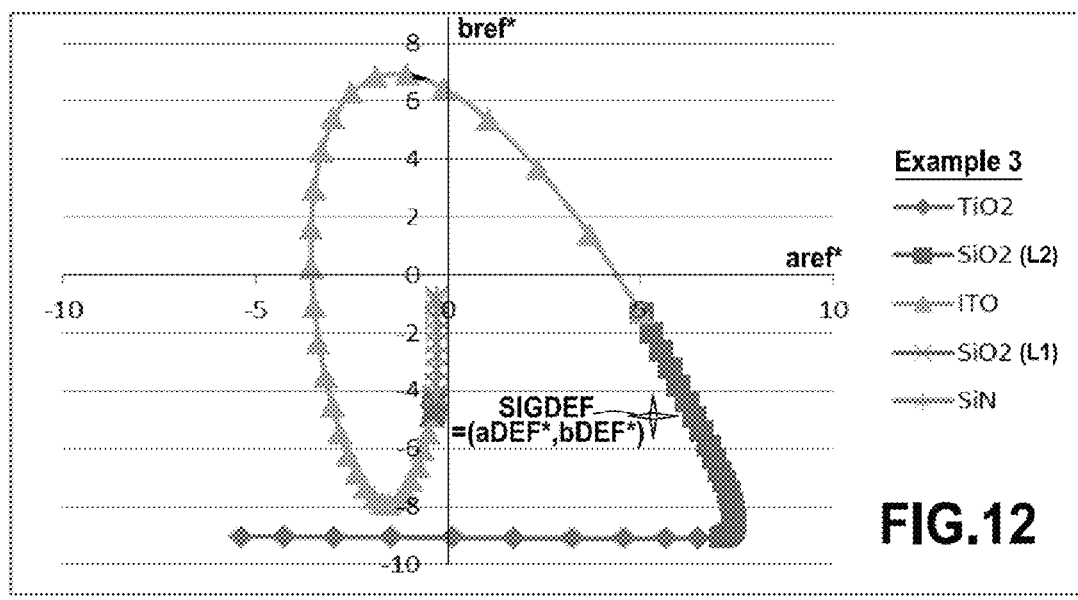

FIG. 12 illustrates an example of reference coordinates (aref*, bref*) obtained for various thicknesses of thin layers deposited in the various compartments 15-$i$, $i=1, \ldots, N$ of the deposition line 2 and leading to a stack of thin layers according to example 3 described above. In this figure, the x-axis represents the component aref* and the y-axis the component bref*. Each thickness corresponding to the deposition produced by one cathode of one of the compartments is illustrated by one type of symbol, the shape of the symbol depending on the material deposited by this cathode (e.g. diamond for the thicknesses corresponding to the deposition of the $TiO_2$ layer, square for the thicknesses corresponding to the deposition of the $SiO_2$ layer (L2), etc.). For the sake of legibility, the deposition thicknesses corresponding to each point shown in the figure have been omitted.

Furthermore, for the sake of simplicity, it is assumed here that each reference signature associated with a thickness is composed of a single value of the components aref* and bref*. However, as mentioned above, it may be envisioned, as a variant, for each thickness to be associated with an interval of aref* values and with an interval of bref* values, or with the limits defining such intervals.

The signature of the defect SIG(DEF) is compared with the reference signatures SIGref(i), $i=1, \ldots, N$, very simply in step F40 by seeking the stack thickness the reference signature of which is closest to the signature of the defect. This thickness is then related as indicated above to the compartment or to the cathode corresponding to a deposition having this thickness. In other words, the identifying module 6C seeks on the reference curve illustrated in FIG. 12, the point (aref*, bref*) closest to the point (aDEF*, bDEF*) (illustrated by a cross in FIG. 12), and deduces therefrom the deposition thickness, then the associated compartment.

As a variant, when the reference signatures comprise an interval of values for aref* and bref* or the limits of such intervals, the identifying module 6C seeks the closest reference signature, in the sense of a predefined distance to the point (aDEF*, bDEF*), and deduces therefrom the deposition thickness, then the associated compartment. Any type of distance may be considered: it may in particular be a question of the distance measured along a normal to the curve defined by the reference intervals considered for aref* and bref* and passing through the point (aDEF*, bDEF*).

The compartment thus determined is identified by the identifying module 6C of the locating device 6 as the compartment liable to be the origin of the defect DEF affecting the coated substrate 5 (step F50).

Following this identification, a maintenance operation may be carried out on the compartment thus identified.

It will be noted that this second embodiment may also be applied to other stack configurations such as for example to a configuration similar to example 2, which comprises two silver layers.

In such a configuration, if ambiguity remains as to the precise location of the compartment, the module 6B for determining the signature of the defect may add, to the signature of the defect, the component LDEF* of the basic surface of the defect, and generate the equivalent component Lref* in the reference signatures of the compartments. A three-dimensional curve illustrating the reference signatures of the compartments 15-$i$, $i=1, \ldots, N$ (or deposition thicknesses corresponding to these compartments) is then obtained, such as illustrated in FIG. 13 for another example stack of thin layers containing two silver layers.

Figure 13:
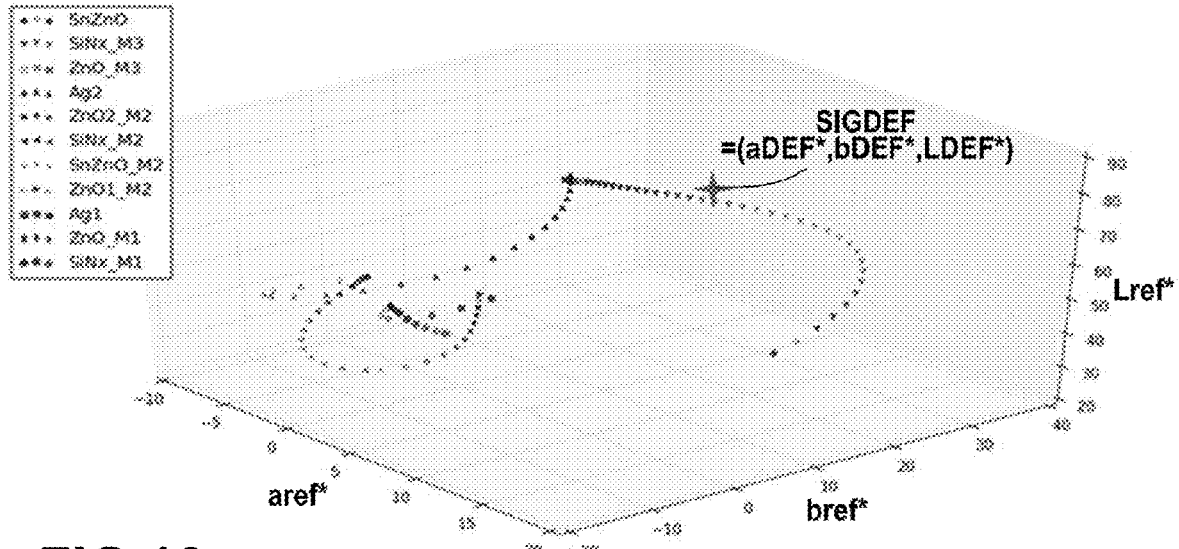

In the comparing step F40, the identifying module 6C seeks the reference signature (point(Lref*,aref*,bref*)) on this curve closest to the signature of the defect (LDEF*, aDEF*,bDEF*) (represented by a cross in FIG. 13). The identifying module 6C then identifies the compartment corresponding to the reference signature thus determined as the compartment in which the defect DEF originated.

Figure 14:
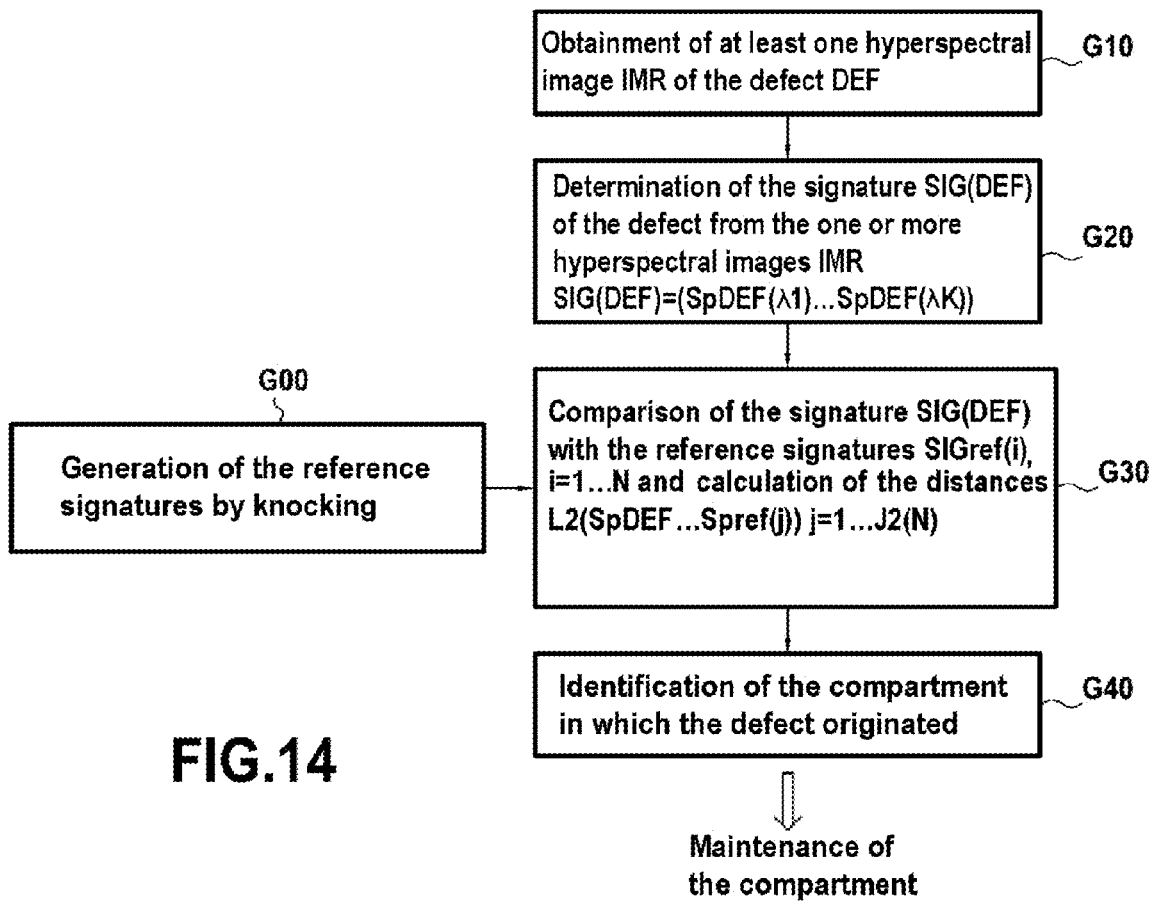

FIG. 14 shows the main steps of the locating method according to the invention such as implemented by the locating device 6 in a third embodiment.

In this third embodiment of the invention, the optical inspecting system 4 is equipped with hyperspectral video cameras and delivers hyperspectral digital images of the defect detected on the coated substrate 5. These hyperspectral images are noteworthy in that they associate, with each pixel of the image, a spectrum over a given wavelength range (reflection or transmission spectrum depending on the configuration of the radiation sources in question). Each spectrum is defined as a vector of K components $Sp(\lambda k)$, $k=1, \ldots, K$, where K is an integer higher than 1, each component $Sp(\lambda k)$ being the value of the reflectance or transmittance of the defect at the wavelength $\lambda k$.

The locating device 6 therefore obtains, from the optical inspecting system 4, a hyperspectral image IMR taken in reflection of the defect detected on the stack of thin layers deposited on the glass substrate 3 (step G10). This image IMR is received by the locating device via its communicating module 23 and its obtaining module 6A.

The locating device 6, via its determining module 6B, then determines, from the hyperspectral image IMR the signature SIG(DEF) of the defect (step G20). To this end, it extracts from the image IMR, the reflection spectrum of the basic surface of the defect, for example using a successive erosion method such as presented above in the first embodiment of the invention and applied to the reflection spectrum of each pixel (a reflection coefficient value is extracted for each wavelength of the reflection spectrum associated with each pixel instead of a single reflection coefficient value per pixel as in the first embodiment).

The signature SIG(DEF) determined by the determining module 6B therefore consists of the K spectral components $SpDEF(\lambda k)$, $k=1, \ldots, K$ thus extracted.

Next, the signature SIG(DEF) of the defect thus obtained is compared by the identifying module 6C of the locating device 6 to a plurality of reference signatures (step G30), each reference signature SIGref(i) being based on the same characteristics as the signature of the defect and being associated with one compartment 15-$i$, $i=1, \ldots, N$ of the deposition line 2.

As in the two first embodiments, the reference signatures may be generated beforehand and stored for example in the nonvolatile memory 22 of the locating device 6. As a variant, they may be stored on a remote storage space and be obtained on request for example via the communicating module 23 of the locating device 6.

As in the described first and second embodiment, the reference signatures may be generated from a knocking experiment, carried out beforehand on the compartments of the deposition line 2 (step G00). Observation, using the optical inspecting system 4, of the pieces of debris generated by each compartment, and in particular of hyperspectral images taken in reflection of these pieces of debris, allows reference spectra Spref to be obtained for each compartment 15-$i$, $i=1, \ldots, N$, or for various deposition thicknesses themselves associated with the compartments 15-$i$, $i=1, \ldots, N$.

It will moreover be noted, as mentioned above for the first and second embodiments, that the correspondences between the reference signatures and the various compartments depend on the configuration of the deposition line 2 and in particular of the cathode sputtering processes in the various compartments 15-$i$.

Figure 15:
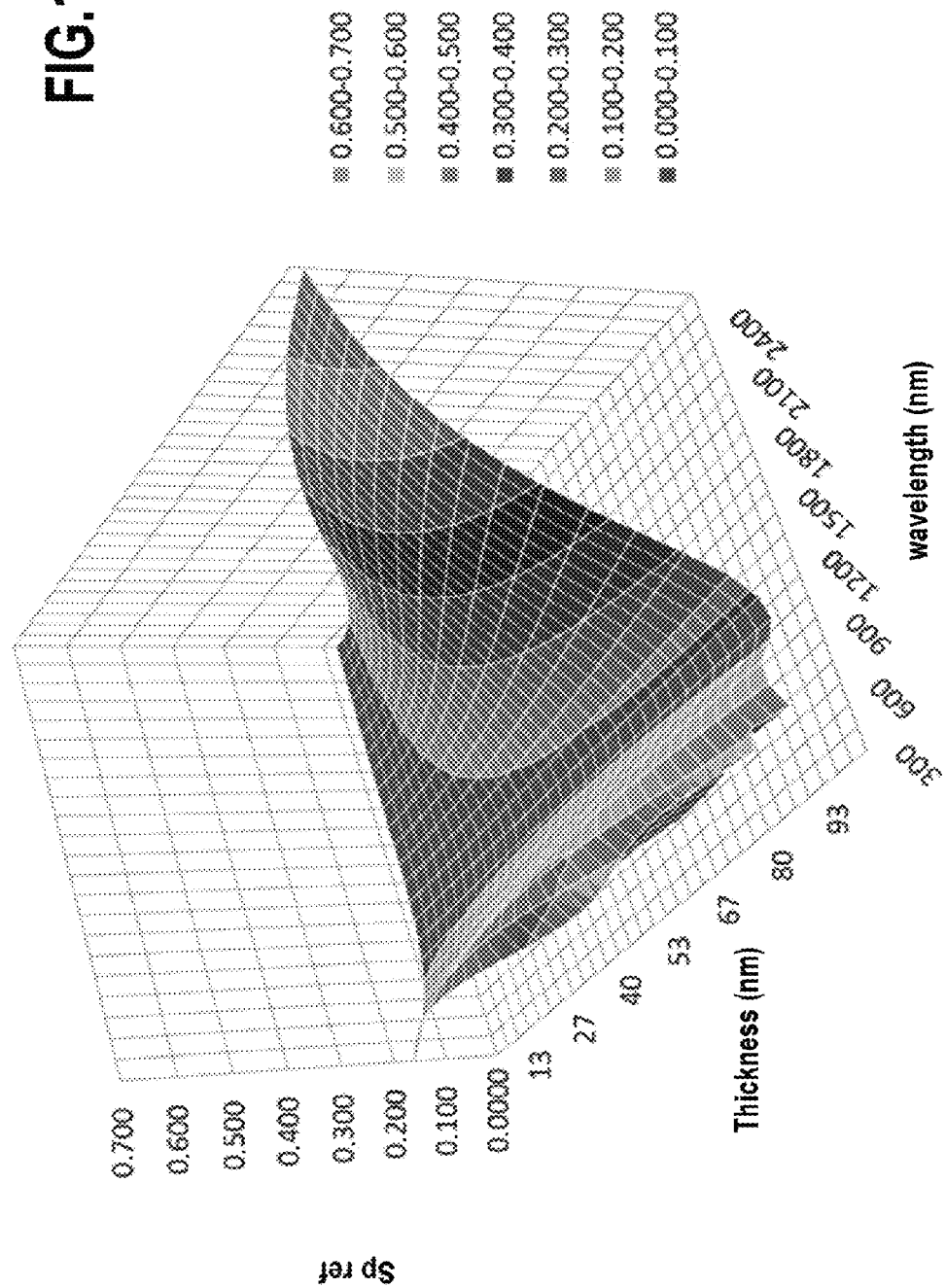

FIG. 15 illustrates an example of reference spectra obtained for various thicknesses of thin layers deposited by the compartments 15-$i$, $i=1, \ldots, N$ of the deposition line 2, for a stack of thin layers according to example 3 as described above. In this figure, the various spectra are given as a function of the thickness of the deposition on the substrate. In other words, to a given compartment 15-$i$, corresponds a set of reference spectra Spref(j), $j=J1(i), \ldots J2(i)$, where J1(i) and J2(i) designate two integers dependent on the index $i$, this set of spectra being easily identifiable from the thickness of the deposition that a given compartment 15-$i$ is responsible for.

Each reference signature SIGref(i) associated with a compartment 15-$i$ therefore comprises a plurality of spectra (Spref(J1(i)) … Spref(J2(i))), the number of spectra J2(i)−J1(i)+1 possibly varying from one compartment to the next depending on the thickness of the thin layer deposited by the compartment and on the envisioned discretization increment, each spectrum Spref(j), $j=J1(i), \ldots, J2(i)$ being defined by a K-component vector.

The signature of the defect SIG(DEF) is compared with the reference signatures SIGref(i), $i=1, \ldots, N$, in the step G30 by the identifying module 6C by calculating a distance (for example measured along an L2-type normal) between the signature of the defect SIG(DEF) and each reference signature SIGref(i). This distance is defined, in the third embodiment described here, by:

$$L2(SpDEF - Spref(j)) = \sqrt{\sum_{k=1}^{K} (SpDEF(k) - Spref(j,k))^2}$$

where $j=1, \ldots, J1(1), J1(2), \ldots J2(N)$.

As a variant, each reference signature associated with a compartment 15-$i$ may only contain two limit spectra bounding, on either side, the section of surface defining the spectra associated with this compartment. In this case, the identifying module 6C may implement two substeps, firstly identifying a first limit spectrum among the reference signatures corresponding to the spectrum closest to the signature of the defect. Since two neighboring compartments share each given limit spectrum, it is then enough for the identifying module 6C to identify among these two neighboring compartments which corresponds to the signature of the defect.

As a variant, other distances may be used to compare the signature of the defect to the reference signatures, for example a distance measured using an L2 normal as indicated above but that includes applying a different weighting factor for wavelengths (indexed by k) belonging to the ultraviolet domain.

The identifying module 6C identifies the compartment associated with the index j minimizing this distance (step G40) as being the compartment of the deposition line 2 in which the defect affecting the coated substrate 5 originated.

Following this identification, a maintenance operation may be carried out on the compartment thus identified.

It will be noted that this third embodiment may be applied identically to other stack configurations such as, for example, configurations similar to that of example 2 and which comprise two silver layers.

In the three first embodiments described above, the locating device 6 determines a signature of the defect from one or more characteristics representative of reflective and/or absorptive properties of the defect, namely in particular a reflection coefficient extracted from an image taken in reflection and/or a transmission coefficient extracted from an image taken in transmission, and compares this defect signature to reference signatures associated with each compartment of the deposition line 2, which are for example obtained via a knocking experiment. Depending on the absorptive and/or reflective properties of the coated substrate 5 and on the type of images delivered by the optical inspecting system (images taken in reflection, in transmission, acquired by means of radiation sources emitting in the visible or infrared wavelength domain, etc.), the signature may need to contain only a single characteristic to allow a single compartment liable to be the origin of the defect to be identified, or, in contrast, a plurality of characteristics may be necessary to identify one single compartment. It will be recalled however that in such a context, it is enough to take into account just one well-chosen characteristic of the defect to drastically decrease the number of compartments that could be the origin of the defect, with respect to the total number of compartments contained in the deposition line.

In some respects, parallels may be drawn between these three embodiments and a decision tree allowing one or more compartments liable to be the origin of the defect to be identified.

We will now describe a fourth embodiment in which the identification of the compartment in which the defect originated is implemented using a learning method. In the fourth embodiment described here, this learning method easily allows a plurality of decision trees to be taken into account.

Figure 16:
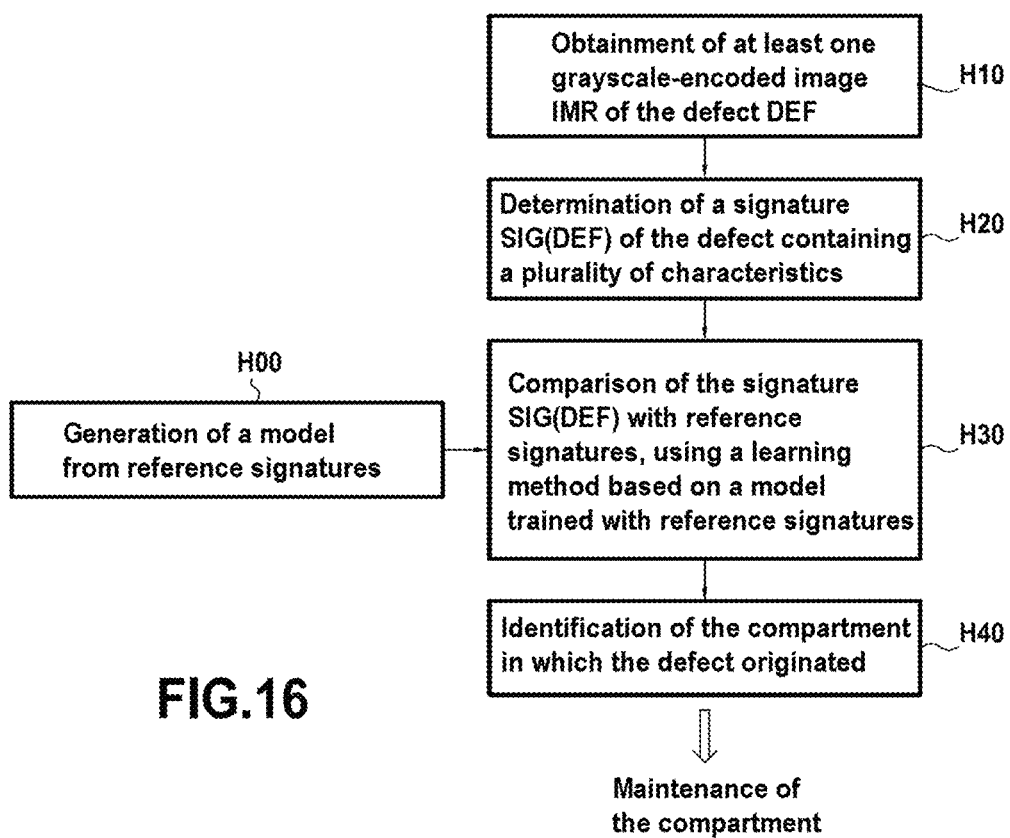

FIG. 16 shows the main steps of the locating method implemented by the locating device 6 in this fourth embodiment.

It is assumed here, as in the first embodiment, that the optical inspecting system 4 generates, for each defect detected at the end of the deposition line 2, grayscale-encoded digital images taken in reflection and/or in transmission. For the sake of simplicity, consideration will be limited, in the rest of the description, to a grayscale-encoded image IMR taken in reflection delivered by the optical inspecting system 4 for each detected defect. It will be noted that this fourth embodiment is also applicable in the case where the optical inspecting system 4 generates and delivers RGB-encoded digital images or hyperspectral images.

The locating device 6 therefore obtains from the optical inspecting system 4 a grayscale-encoded image IMR of the defect detected on the stack of thin layers deposited on the glass substrate 3 (step H10). This image IMR is received by the locating device 6 via its communicating module 23 and its obtaining module 6A.

The locating device 6, via its determining module 6B, then determines, from the image IMR, a signature SIG(DEF) of the defect (step H20). Preferably, the signature SIG(DEF) of the defect contains one or more characteristics relating to the luminous intensity of the defect and/or one or more characteristics relating to a shape of the defect.

More precisely, in the fourth embodiment described here, the signature SIG(DEF) of the defect contains:

characteristics representative of a radial luminous-intensity profile in reflection (or in transmission if the received image is an image taken in transmission) of the defect. Such a profile may comprise a plurality of intensity values measured on the largest diagonal of the defect (for example 8 values or, in other words, 8 characteristics);

characteristics representative of a gradient (slope) of a radial luminous-intensity profile in reflection (or in transmission if the received image is an image taken in transmission) of the defect. Such characteristics are to be compared to the detection of the presence of a light ring described in the first embodiment of the invention;

a characteristic representative of an area of the defect;

a characteristic representative of a ratio of a perimeter of the defect to an area of the defect;

a characteristic representative of an aspect ratio of the defect;

a characteristic representative of an average luminous intensity in reflection (or in transmission if the received image is an image taken in transmission) of the defect; and a characteristic representative of a luminous intensity in reflection (or in transmission if the received image is an image taken in transmission) at the center of the defect.

The extraction of these characteristics will cause no difficulty per se to a person skilled in the art and is not described in detail here.

Of course, this list is not exhaustive and other characteristics may easily be extracted from the image IMR to represent the defect DEF.

Next, the signature SIG(DEF), of the defect, thus obtained is compared by the identifying module 6C of the locating device 6 to the reference signatures (step H30), each reference signature SIGref(i) being based on the same characteristics as the signature of the defect and being associated with one distinct compartment 15-$i$, i=1, . . . , N, of the deposition line 2.

In the fourth embodiment described here, the reference signatures are generated beforehand from what is called a training set made up of a plurality of images of defects detected at the end of the deposition line 2, which images are acquired by the optical inspecting system 4 over a plurality of production days. For each of these images, the signature of the defect is determined on the basis of the same characteristics chosen in step H20, and the compartment in which the defect originated or the corresponding deposition thickness is associated with this (what is called reference) signature. This compartment or this deposition thickness is determined experimentally, for example by tapping on the compartments of the deposition line 2 for each detected defect, or using a locating method according to the invention in its first embodiment described above.

These reference signatures are then used, in the fourth embodiment described here, to generate decision trees (step H00). As is known, such trees may be used by way of predictive model allowing the value of a characteristic of a system to be evaluated from observation of other characteristics of the same system. In other words, in the case envisioned here, it is a question of using these decision trees trained using the reference signatures of the compartments of the deposition line 2 to predict the compartment in which the defect originated from its signature. The decision trees are therefore here created from reference signatures extracted from the images of the training set and compartment information associated with these signatures. These decision trees therefore model per se the reference signatures of each of the compartments 15-i.

Using these decision trees and a learning algorithm based on such trees, such as for example a random decision forest algorithm, the identifying module 6C may automatically "class" the signature SIG(DEF) of the defect, i.e. associate therewith a reference signature or even directly a compartment of the deposition line 2 the reference signature of which corresponds to the signature of the defect. Such a learning algorithm is known per se and is not described in more detail here. It is for example described in the document by T. Hastie et al. entitled "The elements of statistical learning—Data Mining, Inference and Prediction", second edition, Springer.

As a variant, other algorithms allowing elements to be classed with respect to each other (the elements here being signatures associated with compartments) may be considered, such as for example nearest neighbor algorithms, support vector machine (SVM) algorithms or algorithms based on neural networks.

The identifying module 6C identifies the compartment thus determined by the learning algorithm and corresponding to the signature of the defect as being the compartment in which the defect originated (step H40).

Following this identification, a maintenance operation may be carried out on the compartment thus identified.

The four embodiments described above make possible rapid and effective identification of that compartment of a deposition line which was the origin of a defect affecting a stack of thin layers produced by the deposition line. It should be noted that these embodiments were described with reference to a deposition line in which the deposition was by magnetron cathode sputtering. However, the invention is applicable to other deposition methods liable to be affected by similar problems (whatever the type of debris and generated defects), for example other sputtering methods such as ion beam sputtering (IBS) or ion beam assisted deposition (IBAD), or even a deposition method such as evaporation, chemical vapor deposition (CVD), plasma enhanced chemical vapor deposition (PECVD), low-pressure chemical vapor deposition (LPCVD), etc.

The invention claimed is:

1. A method for locating, in a deposition line comprising a succession of compartments, an origin of a defect affecting a stack of thin layers deposited on a substrate in said compartments, in which each thin layer of a material is deposited in one or more successive compartments of the deposition line and pieces of debris remaining on the surface of a thin layer deposited in a compartment act as masks for the subsequent depositions of thin layers and are the origin of defects, the method comprising:

a step of obtaining at least one image showing said defect, said at least one image being acquired by at least one optical inspecting system placed at the end of the deposition line;

a step of determining, from said at least one image, a signature of the defect, the signature containing at least one characteristic representative of the defect; and a step of identifying at least one compartment of the deposition line liable to be the origin of the defect from the signature of the defect and using reference signatures associated with the compartments of the deposition line, wherein the identifying step comprises a step of comparing the signature of the defect with a plurality of reference signatures each associated with compartments of the deposition line, said at least one compartment identified as being liable to be the origin of the defect being associated with a signature corresponding to the signature of the defect.

2. The method as claimed in claim 1, wherein the deposition of thin layers is carried out by the deposition line on the substrate by magnetron cathode sputtering.

3. The method as claimed in claim 1, wherein the substrate is a transparent substrate made of mineral glass or made of a polymeric organic material.

4. The method as claimed in claim 1, wherein:

said at least one image comprises a gray scale-encoded image taken in reflection and the signature of the defect contains a characteristic defined with respect to a reflection coefficient of the defect, which is determined from the image taken in reflection; and/or said at least one image comprises a grayscale-encoded image taken in transmission, and the signature of the defect contains a characteristic defined with respect to a transmission coefficient of the defect, which is determined from the image taken in transmission.

5. The method as claimed in claim 4, wherein said coefficient is determined using a successive erosion method applied to the defect shown in the grayscale-encoded image.

6. The method as claimed in claim 4, furthermore comprising:

a step of determining a gradient of variation in the coefficient; and a step of detecting a shape of the defect on the basis of the determined variation gradient.

7. The method as claimed in claim 4, further comprising a step of detecting a presence of a light ring on the perimeter of the defect shown in said at least one image, the signature of the defect containing a characteristic expressing the presence.

8. The method as claimed in claim 1, wherein said at least one image comprises two grayscale-encoded images acquired by said at least one optical system using two radiation sources emitting in two at least partially distinct wavelength domains.

9. The method as claimed in claim 1, wherein:

said at least one image comprises a red-green-blue (RGB) encoded image taken in reflection or in transmission;

the method furthermore comprises a step of converting the RGB image to an L*a*b* color space; and the signature of the defect contains the a* and b* components of a basic surface of the defect, which components are determined from the converted image.

10. The method as claimed in claim 9, wherein the signature of the defect furthermore comprises an L* component of the defect, which is determined from the converted image.

11. The method as claimed in claim 1, wherein said at least one image comprises a hyperspectral image and the signature of the defect contains a spectrum representing values of a reflection coefficient or of a transmission coefficient of a basic surface of the defect as a function of a wavelength.

12. The method as claimed in claim 11, wherein each reference signature associated with a compartment of the deposition line comprises a plurality of spectra corresponding to various thicknesses of the layer deposited in said compartment.

13. The method as claimed in claim 1, wherein the reference signatures associated with the compartments of the deposition line are determined experimentally by knocking on each of the compartments so as to generate in each compartment pieces of debris resulting from the knocking.

14. The method as claimed in claim 1, wherein the identifying step comprises applying a machine learning method to the signature of the defect, said learning method being based on a model trained using reference signatures associated with the compartments of the deposition line.

15. The method as claimed in claim 1, wherein the signature of the defect contains at least one characteristic relating to the luminous intensity of the defect and/or one characteristic relating to a shape of the defect.

16. The method as claimed in claim 15, wherein said at least one characteristic relating to the luminous intensity of the defect comprises:
characteristics representative of a radial luminous-intensity profile of the defect; and/or
characteristics representative of a slope of a radial luminous-intensity profile of the defect; and/or
a characteristic representative of an average luminous intensity of the defect;
and/or
a characteristic representative of a luminous intensity at the center of the defect.

17. The method as claimed in claim 15, wherein said at least one characteristic relating to a shape of the defect comprises:
a characteristic representative of an area of the defect; and/or
a characteristic representative of a ratio of a perimeter of the defect to an area of the defect; and/or
a characteristic representative of an aspect ratio of the defect.

18. The method as claimed in claim 1, wherein the stack of thin layers forms an interferential system.

19. The method as claimed in claim 1, wherein the reference signatures associated with the compartments of the deposition line depend on a configuration of the deposition line during the deposition of the thin layers on the substrate.

20. A non-transitory computer-readable recording medium on which is stored a computer program that, when executed by a computer, causes the computer to execute the method as claimed in claim 1.

21. A device for locating an origin of a defect affecting a stack of thin layers deposited on a substrate in a plurality of compartments that succeed one another in a deposition line, in which each thin layer of a material is deposited in one or more successive compartments of the deposition line and pieces of debris remaining on the surface of a thin layer deposited in a compartment act as masks for the subsequent depositions of thin layers and are the origin of defects, the device comprising:
at least one processor configured to implement
a module for obtaining at least one image showing the defect, which at least one image is acquired by at least one optical inspecting system placed at the end of the deposition line;
a module for determining, from said at least one image, a signature of the defect, the signature containing at least one characteristic representative of the defect; and
a module for identifying at least one compartment of the deposition line liable to be the origin of the defect from the signature of the defect and using reference signatures associated with the compartments of the deposition line,
wherein the module for identifying further performs comparing the signature of the defect with a plurality of reference signatures each associated with compartments of the deposition line, said at least one compartment identified as being liable to be the origin of the defect being associated with a signature corresponding to the signature of the defect.

22. A system comprising:
a deposition line comprising a succession of compartments able to deposit a stack of thin layers on a substrate, in which each thin layer of a material is deposited in one or more successive compartments of the deposition line and pieces of debris remaining on the surface of a thin layer deposited in a compartment act as masks for the subsequent depositions of thin layers and are the origin of defects;
at least one optical inspecting system placed at the end of the deposition line and configured to deliver at least one image showing a defect affecting the stack of thin layers deposited on the substrate; and
the locating device as claimed in claim 21, able to identify, among the succession of compartments of the deposition line, at least one compartment liable to be the origin of the defect.

23. The method as claimed in claim 1, wherein:
said at least one image comprises a grayscale-encoded image taken in transmission, and the signature of the defect contains a characteristic defined with respect to a transmission coefficient of the defect, which is determined from the image taken in transmission.

* * * * *